(12) United States Patent
Kawashima

(10) Patent No.: US 7,518,707 B2
(45) Date of Patent: Apr. 14, 2009

(54) EXPOSURE APPARATUS

(75) Inventor: Miyoko Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 268 days.

(21) Appl. No.: 11/366,558

(22) Filed: Mar. 3, 2006

(65) Prior Publication Data

US 2006/0197933 A1 Sep. 7, 2006

(30) Foreign Application Priority Data

Mar. 3, 2005 (JP) ............................. 2005-058685

(51) Int. Cl.
*G03B 27/72* (2006.01)
(52) U.S. Cl. .............................. 355/71; 355/53; 355/67
(58) Field of Classification Search .................. 355/53, 355/67, 71; 359/489
See application file for complete search history.

(56) References Cited

U.S. PATENT DOCUMENTS

| | | | | |
|---|---|---|---|---|
| 5,144,362 | A * | 9/1992 | Kamon et al. .................. 355/53 |
| 5,675,164 | A * | 10/1997 | Brunner et al. .............. 257/331 |
| 6,351,304 | B1 | 2/2002 | Kawashima et al. .......... 355/55 |
| 6,403,291 | B1 | 6/2002 | Kawashima et al. ........ 430/394 |
| 6,534,242 | B2 | 3/2003 | Sugita et al. ................ 430/312 |
| 6,555,274 | B1 * | 4/2003 | Kye et al. ........................ 430/5 |
| 6,780,574 | B2 | 8/2004 | Kawashima ................ 430/394 |
| 6,930,754 | B1 | 8/2005 | Sugita et al. .................. 355/53 |
| 7,023,522 | B2 | 4/2006 | Sugita et al. .................. 355/53 |
| 2002/0157081 | A1 * | 10/2002 | Shi et al. ....................... 716/19 |
| 2003/0215616 | A1 * | 11/2003 | Pierrat ...................... 428/195.1 |
| 2006/0197930 | A1 | 9/2006 | Kawashima et al. .......... 355/55 |
| 2006/0197933 | A1 | 9/2006 | Kawashima ................. 355/67 |

FOREIGN PATENT DOCUMENTS

| | | |
|---|---|---|
| JP | 07-037781 | 2/1995 |
| JP | 07-142361 | 6/1995 |

OTHER PUBLICATIONS

Machine Translation of JP H07-037781, Jul. 23, 2008, <http://www4.ipdl.inpit.go.jp/Tokujitu/tjsogodben.ipdl?N0000=115>, INPIT.*

* cited by examiner

*Primary Examiner*—Diane I Lee
*Assistant Examiner*—Steven H Whitesell-Gordon
(74) *Attorney, Agent, or Firm*—Fitzpatrick, Cella, Harper & Scinto

(57) ABSTRACT

An exposure apparatus includes a projection optical system for projecting a pattern of a mask onto a plate to be exposed. A pupil filter has a first area arranged on a light axis of the projection optical system and a second area formed outside of the first area. The mask is one of an alternating phase shift mask and a chromeless phase shift mask, and the pattern of the mask satisfies $(p/\lambda) \cdot NA \geq 0.65$, where p is a half pitch of the pattern, $\lambda$ is a wavelength of light illuminating the mask, and NA is an image-side numerical aperture of the projection optical system, and in which, at most, $1^{st}$ order light of diffracted light, which is diffracted by the pattern satisfying $(p/\lambda) \cdot NA \geq 0.65$ passes the first area and a part of the diffracted light having one order of at least $2^{nd}$ order light passes the second area, and, with respect to the light having one order among the at least $2^{nd}$ order light of the diffracted light, a phase of the light that has passed the second area and a phase of the light that has passed an area other than the second area of the pupil filter are inverted with each other.

6 Claims, 27 Drawing Sheets

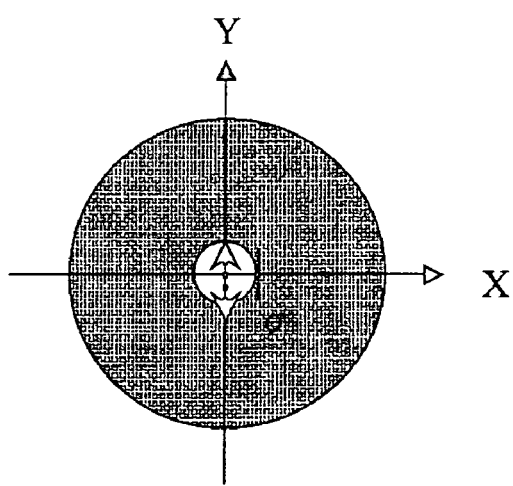
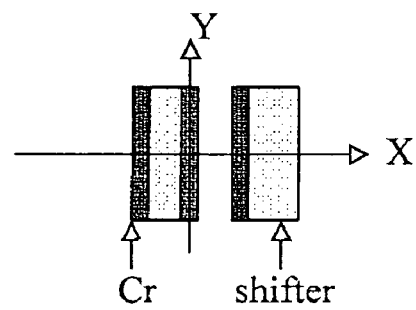
FIG. 5A                    FIG. 5B

MASK

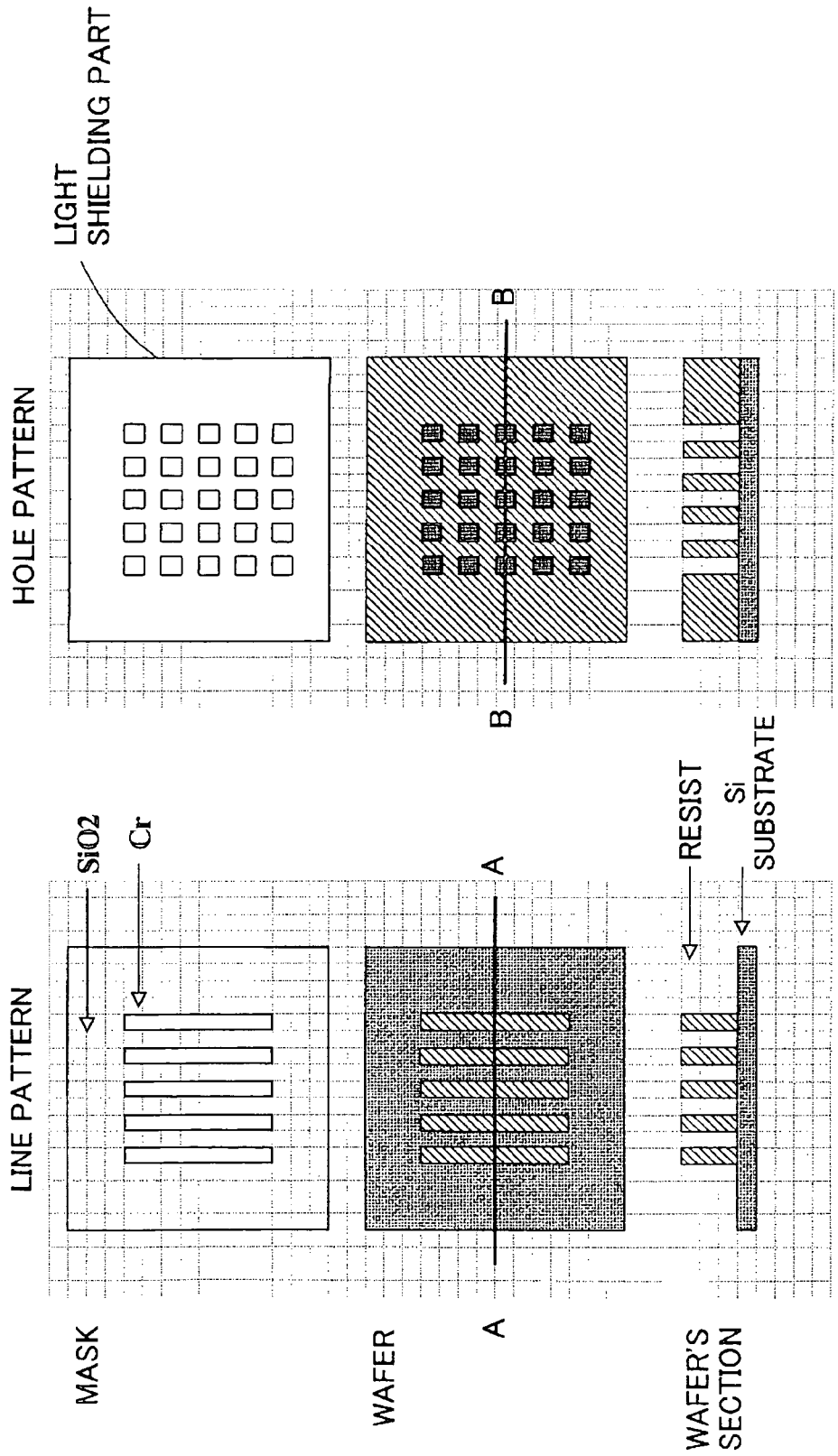

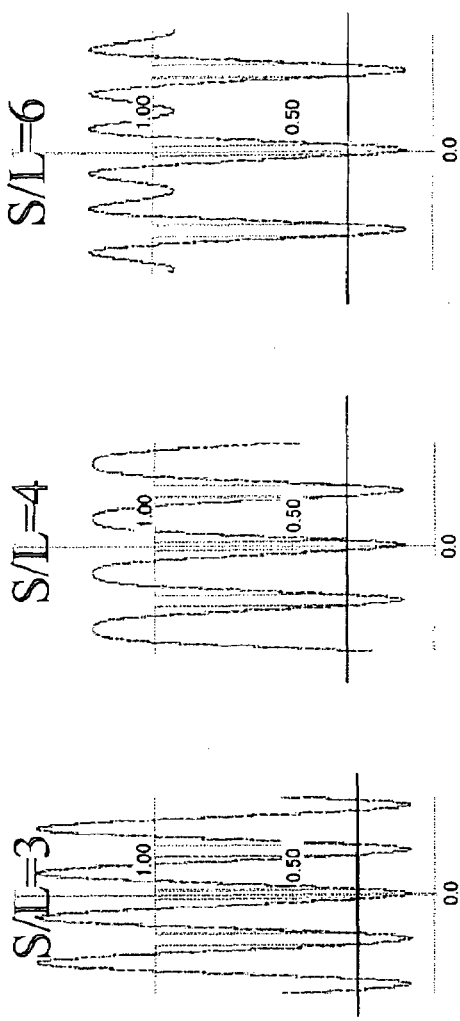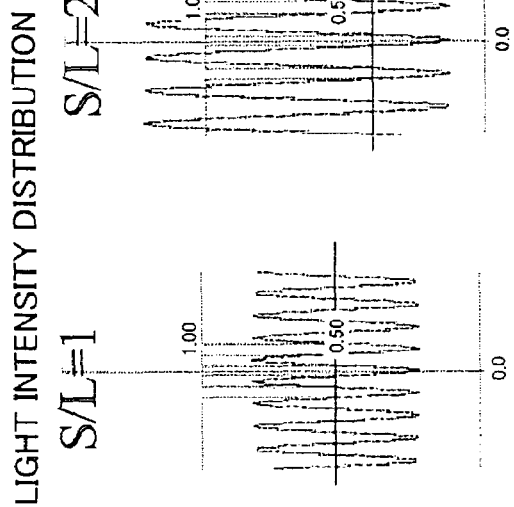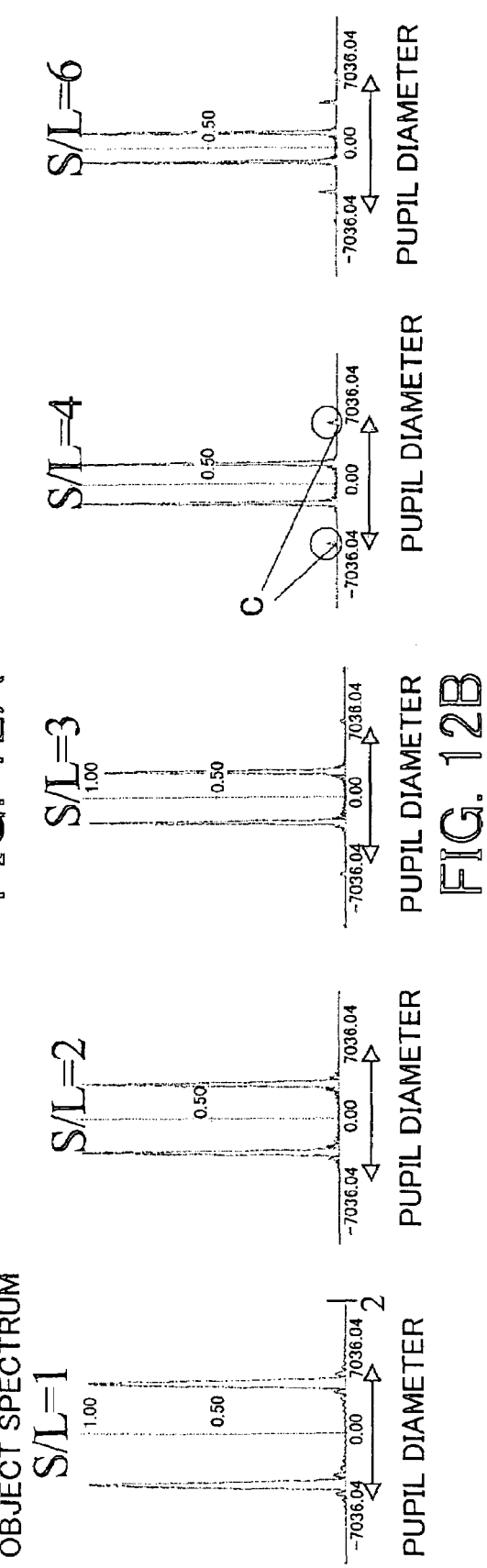
FIG. 12A
FIG. 12B

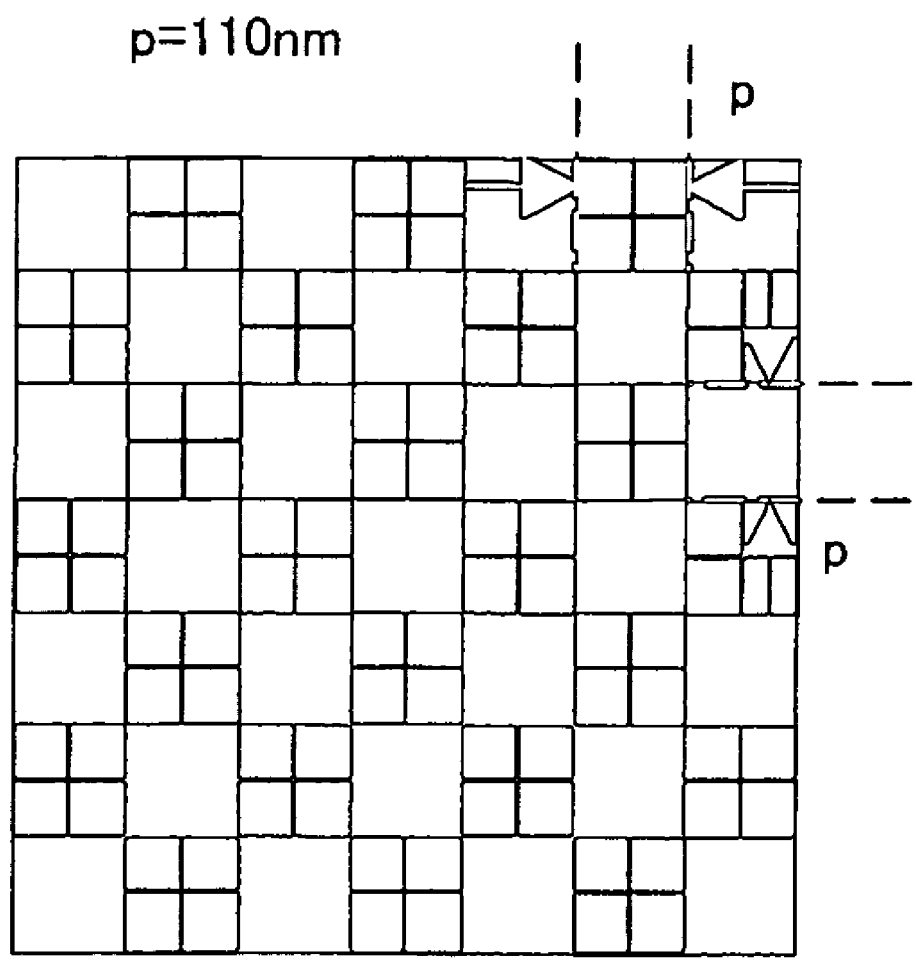
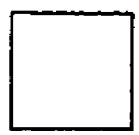 SHEFTER
FIG. 18 w=55nm、p=110nm
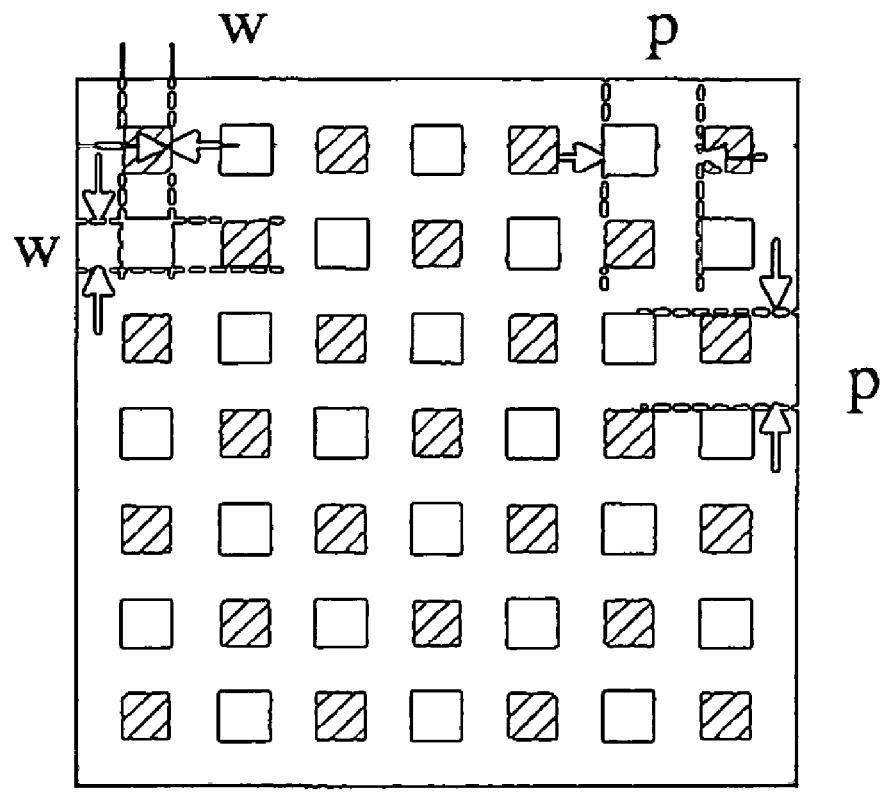
 shifter
FIG. 19 w=55nm, p=275nm

EXPOSURE APPARATUS

This application claims foreign priority benefit based on Japanese Patent Application No. 2005-058685, filed on Mar. 3, 2005, which is hereby incorporated by reference herein in its entirety as if fully set forth herein.

BACKGROUND OF THE INVENTION

The present invention relates generally to exposure, and more particularly, to an exposure apparatus and a manufacturing method of manufacturing various devices including semiconductor chips, such as ICs and LSIs, display devices, such as liquid crystal panels, sensing devices, such as magnetic heads, and image pickup devices, such as CCDs, as well as a fine pattern used for micromechanics. Here, the term micromechanics refers to technology for applying the semiconductor IC fabricating technique for fine structure manufactures, thereby, creating an enhanced mechanism system that operates at a level of a micron.

A conventional projection exposure apparatus uses a projection optical system to expose a circuit pattern of a mask (reticle) onto a wafer, etc., and a high-resolution exposure apparatus is increasingly demanded.

Since a minimum size (resolution) to be transferred by a projection exposure apparatus is in inverse proportion to the numerical aperture ("NA") of a projection optical system, an improvement of the NA of the projection optical system is accelerated, and a development of a projection optical system having an NA of 0.9 is being promoted. However, a method that simply increases the NA of the projection optical system and improves the resolution has limits of a high NA scheme, because the depth of the focus ("DOF") narrows in inverse proportion to the square of the NA, and the DOF necessary to manufacture devices is hard to assure in a higher NA scheme. Accordingly, the recent technological development attempts to obtain both a high resolution and a long DOF.

For example, one proposed exposure apparatus places a partially phase inverting pupil filter on a pupil plane or a Fourier transformation plane in the projection optical system for improved imaging performance. See, for example, Japanese Patent Application, Publication No. 07-037781. This exposure apparatus can thereby improve both the imaging performance and the DOF.

However, as a mask pattern increases an interval and becomes sparse (i.e., non-dense), not only does a $1^{st}$ order diffracted light of the object spectrum, but also, a higher order diffracted light that has an antiphase to the first order diffracted light, enters the pupil, decreasing the DOF. When a pattern has an interval narrow enough for a dense pattern, a two-beam interference between the $1^{st}$ order diffracted lights provides a desired DOF. However, as the pattern interval increases, a higher order diffracted light, which has an antiphase to the $1^{st}$ order diffracted light, is incident, in addition to the $\pm 1^{st}$ order diffracted lights, and interferes with the $\pm 1^{st}$ order diffracted lights, disturbing imaging in defocus. The pupil filter of Japanese Patent Application, Publication No. 07-037781, normalizes a pupil radius to one, and inverts a phase in a range between r1<r<r2, where r is a radial position on the pupil plane, r1 being set to nearly 0.25, and r2 being set to nearly 0.92. This method has an increased DOF effect to a contact hole pattern, but decreases the DOF to a line pattern, to the contrary.

On the other hand, an alternating phase shift mask ("PSM"), which is often used to improve the resolution partially inverts a phase of the transmission light. However, even the alternating PSM poses the same problem as the mask pattern interval increases. There is no known method that can assure a similar DOF to both a dense pattern having a small pattern interval and a sparse pattern having a large pattern interval.

BRIEF SUMMARY OF THE INVENTION

The present invention is directed to an exposure method and apparatus that provide a polarization illumination condition suitable for a contact hole pattern and a line pattern.

An exposure apparatus according to one aspect of the present invention includes a projection optical system for projecting a pattern of a mask onto a plate to be exposed, and a pupil filter that includes a first area and a second area located outside of the first area, the first area being formed as a circular area upon which a low order diffracted light, which has passed the pattern of the mask, is incident, the second area being formed as an annular area upon which a high order diffracted light that does not contain the low order diffracted light is incident and which inverts a phase of (half of) the high order diffracted light incident and cancels the high order diffracted light.

A device manufacturing method according to another aspect of the present invention includes the steps of exposing a plate using the above exposure apparatus, and developing the plate that has been exposed.

Other objects and further features of the present invention will become readily apparent from the following description of the preferred embodiments with reference to the accompanying drawings.

BRIEF DESCRIPTION OF THE DRAWINGS

FIGS. 5A and 5B are schematic plan views of a polarization direction of an illumination light and a pattern direction on the pupil plane, respectively.

FIGS. 10A AND 10B are schematic plan views of wafers and masks.

FIGS. 12A and 12B are graphs showing a relationship between the light intensity distribution, an object spectrum, and a pupil.

FIG. 18 is a schematic plan view of a chromeless type PSM.

FIG. 19 is a schematic plan view of an Alt-PSM.

DETAILED DESCRIPTION OF THE PREFERRED EMBODIMENTS

Before an exposure apparatus 1 according to one aspect of the present invention is described, a problem of the prior art will be discussed in detail with reference to the accompanying drawings.

A current resist having a good resolving performance generally uses a positive resist, in which an illumination part dissolves after development and a non-illuminated part remains, as shown in FIGS. 10A and 10B. In each of FIGS. 10A and 10B, a view above is a plan view of the mask, a middle view is a plan view of a wafer, and a view below is a sectional view of the wafer. FIG. 10A (left side) shows a line pattern, and FIG. 10B (right side) shows a hole pattern. A white part is a light transmitting part, and a black part is a light shielding part in the mask.

A resist or photosensitive agent is applied onto a Si substrate on the wafer plate in FIGS. 10A and 10B. The wafers in FIGS. 10A and 10B show resist images after the transferred pattern is developed. The wafer sections are sections taken along lines A-A and B-B. As seen in the sections A-A and B-B, the illuminated part dissolves in the development solution, and the substrate is exposed. The non-illuminated part of the transferred pattern on the wafer plane does not dissolve in the development solution, and the resist remains.

The line pattern used for a circuit is as seen as a light shielding part in the view above in FIG. 10A, in order to leave the resist on the substrate. On the other hand, the contact hole pattern is drawn as a light transmitting part on the resist, as shown in the view above in FIG. 10B, so as to pierce the resist and cause the current to flow to another layer. A gate pattern is configured as a line pattern on the light shielding line.

Figure 11:
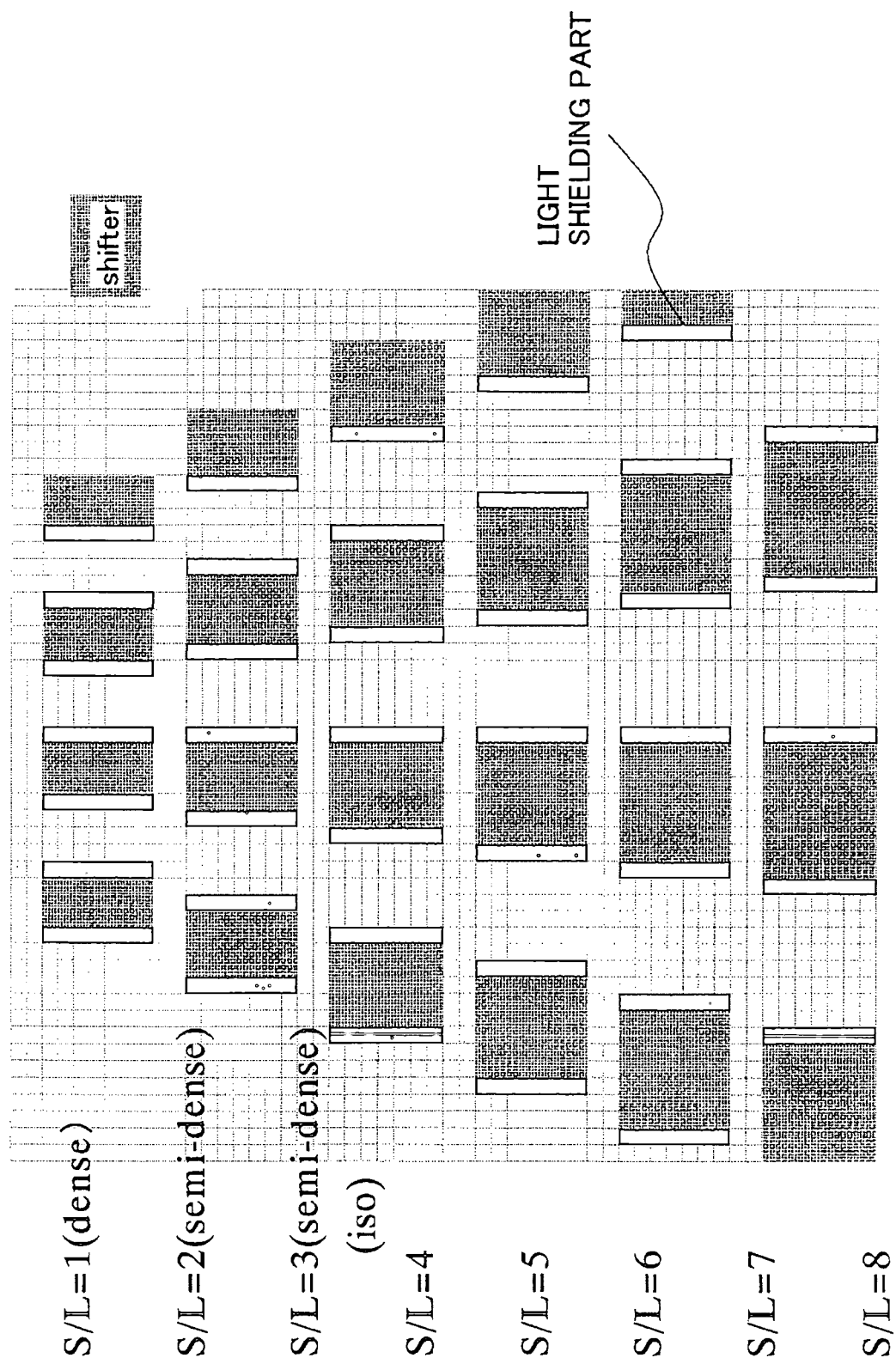
FIG. 11 is a schematic plan view of an alternating phase shift mask ("Alt-PSM").

An alternating PSM is generally used to improve the resolution of a fine line pattern. A pattern for the alternating PSM holds a light-shielding line pattern, as shown in FIG. 11, and inverts a phase only at one side of a glass plate. The phase inversion part is called a phase shifter or a shifter. The same principle is applied to a chromeless PSM that has no light shielding part, and forms a pattern only at a boundary of the phase shifter. A description will now be given of the alternating PSM. Here, FIG. 11 is a plan view of the alternating PSM.

In general, a pattern of the alternating PSM resolves with $k1=L/\lambda \times NA=0.25$ by a perpendicularly incident, coherent illumination, where L is a critical dimension ("CD") of a line and space ("L/S") or a half pitch, $\lambda$ is a wavelength of the illumination light, and NA is an image-side numerical aperture of the projection optical system. A sufficiently large DOF is obtained near the resolution limit.

Assume that the pattern of the alternating PSM is exposed with the exposure light of an ArF excimer laser, a projection optical system having an NA of 1.35, and an effective light source having a $\sigma$ value of 0.2. The value of $\sigma$ is a ratio between a mask-side NA of an illumination optical system and an object-side NA of the projection optical system. As shown in FIG. 11, the CD of the line pattern is set to 45 nm, and an interval between patterns is changed as 45×1=45 nm, 45×2=90 nm, 45×3=135 nm, . . . . In FIG. 11, a dense pattern is defined as a pattern that has a ratio of S/L=1. A semi-dense pattern is defined as a pattern that has a S/L=2 to 3. An isolated pattern is a pattern that has a SL>4. In these equations, S is an interval, and L is a CD.

The intensity distribution and the object spectrum of light in the pattern of FIG. 11 are shown in FIGS. 12A and 12B. FIG. 12A shows a light intensity, and FIG. 12B shows a relationship between an object spectrum and a pupil diameter.

As shown in FIG. 12A, as the pattern pitch in FIG. 11 increases, the light intensity distribution shape changes. In addition, as shown in FIG. 12B, a high order diffracted light of the object spectrum enters the pupil, in addition to the $1^{st}$ order diffracted light. Only two $1^{st}$ order diffracted lights of the object spectrum enter the pupil up to the interval of nearly 135 nm with a pitch of 180 nm (S/L=3), but a high order diffracted light C enters in addition to the $1^{st}$ order diffracted light after the interval is 45×4=180 nm (S/L=4) or greater.

Figure 13A:
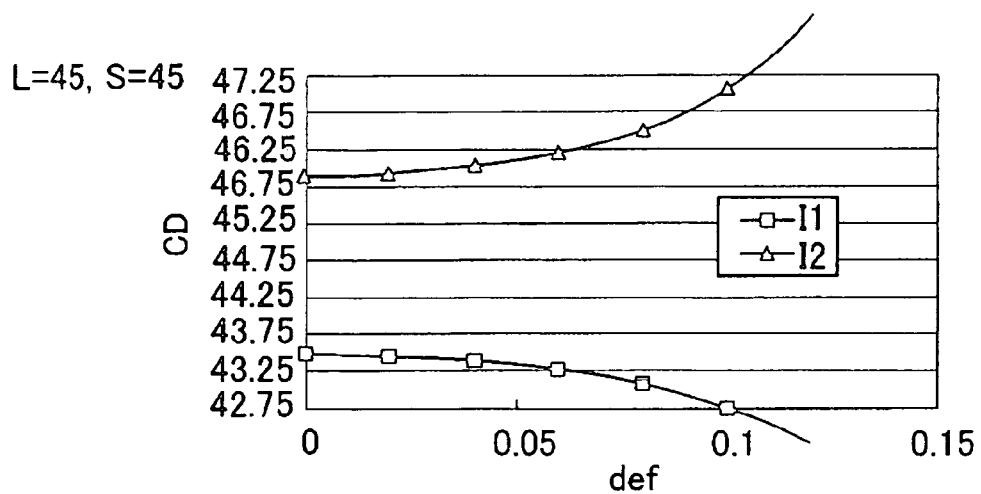
FIGS. 13A-13C are graphs showing a relationship between a critical dimension ("CD") and defocus.
Figure 13B:
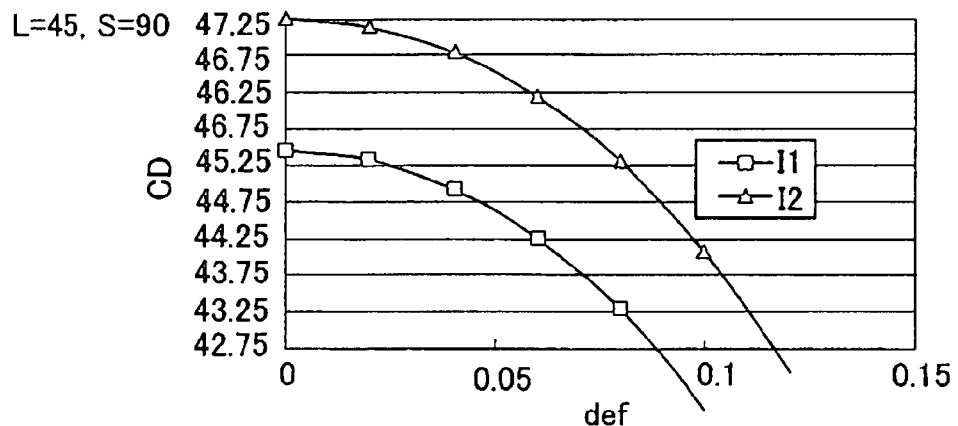
Figure 13C:
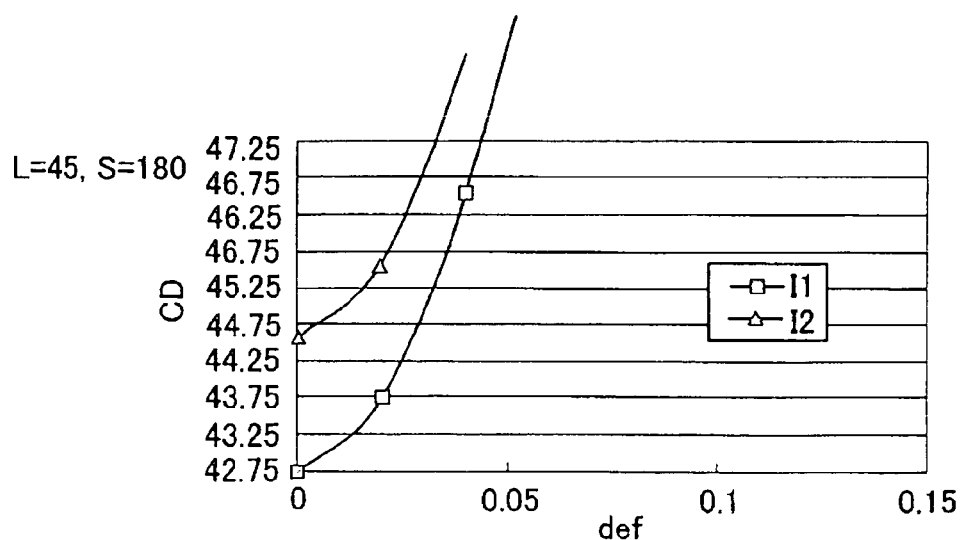

FIG. 13 is a relationship between the CD and defocus for intervals of 45×1=45 nm, 45×2=90 nm, 45×4=180 nm. In FIG. 13, an abscissa axis denotes the defocus, and an ordinate axis denotes the CD. FIG. 13 shows a CD change relative to the defocus between an exposure-dose upper limit I1 and an exposure-dose lower limit I2. The CD indicates only a range of ±5% of 45 nm. The upper and lower limits of the exposure dose are set to be ±2.5% of the reference exposure dose. The DOF is defined as the focus range of ±5% of the CD change within the range of ±2.5% of the upper and lower limits of the exposure dose.

As shown in FIG. 13, for the interval of 45×1=45 nm, the CD is unlikely to change even with defocus, and a sufficient DOF can be obtained. For the interval of 45×2=90 nm, the CD is likely to change with defocus and the DOF slightly lowers. For the interval of 45×4=180 nm, the CD abruptly changes and a sufficient DOF is hard to obtain.

Figure 14:
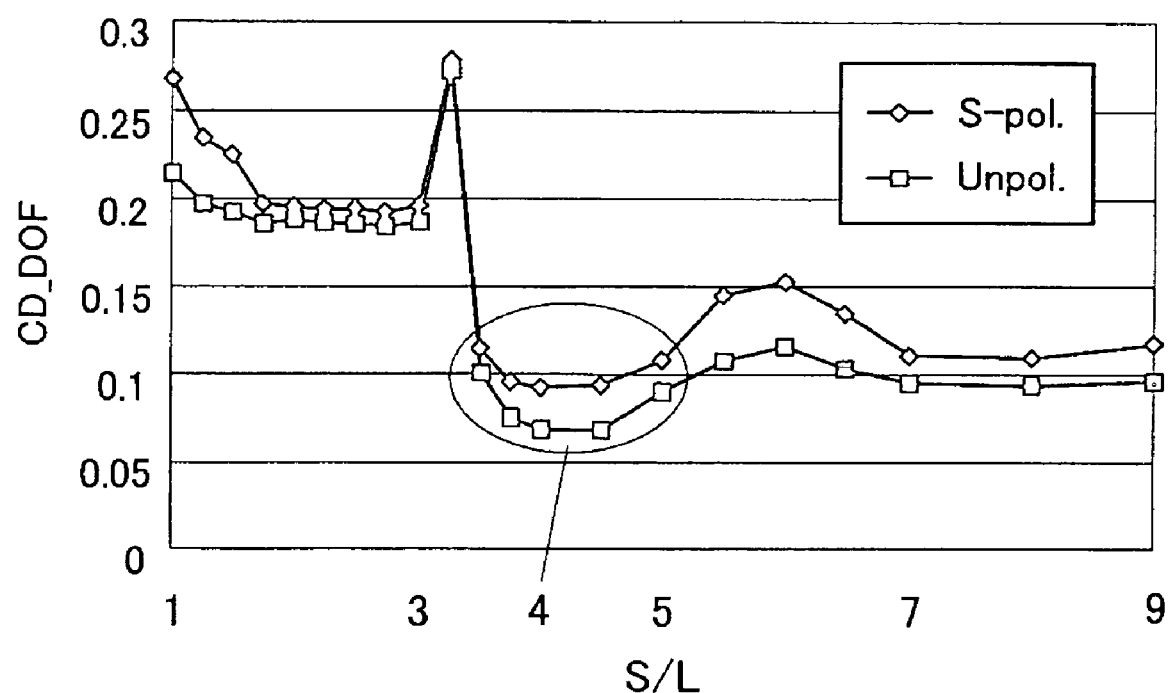
FIG. 14 is a graph showing a relationship between a depth of focus ("DOF") and a ratio (S/L) between an interval and a CD.

These results are summarized in FIG. 14. FIG. 14 shows a relationship between the obtained DOF and a ratio (S/L) between the interval, and the CD for a line pattern having a CD of 45 nm, while intervals between the patterns are changed as of 45×1=45 nm, 45×2=90 nm, 45×4=180 nm. In FIG. 14, an abscissa axis denotes a ratio (S/L) between the interval and the CD, and the ordinate axis denotes the DOF. As described above, the DOF is defined as a focus range of ±5% of the CD change within an exposure dose range of ±2.5% of the reference exposure dose.

Figure 4:
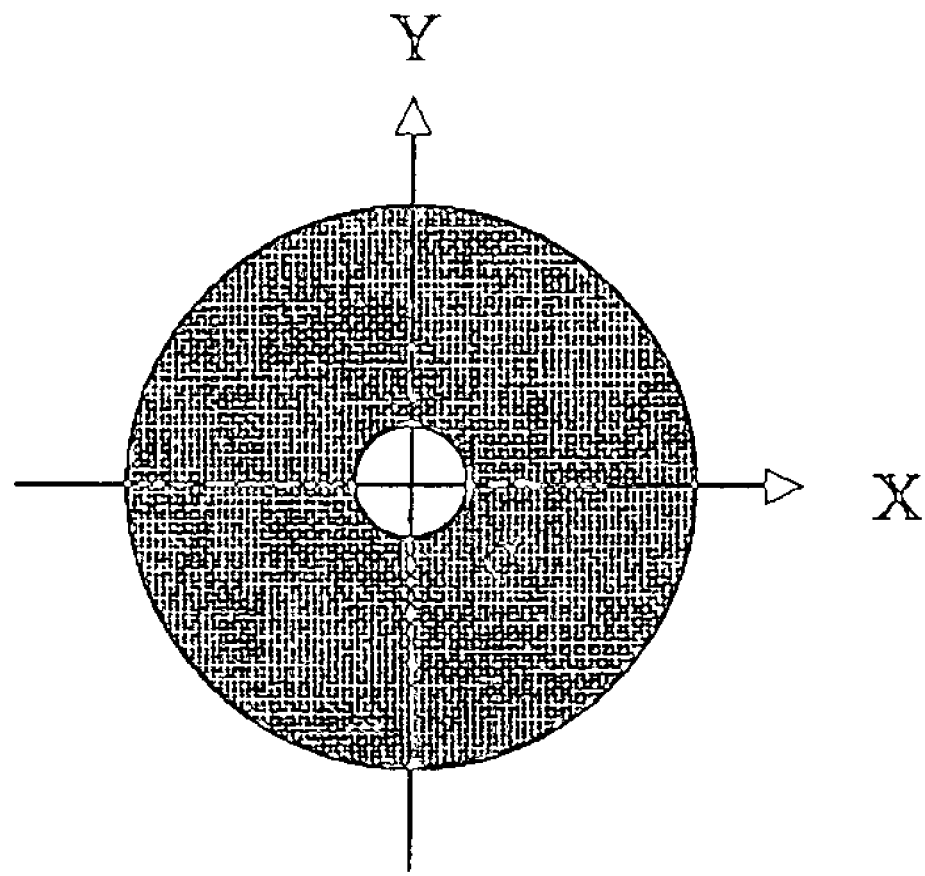
FIG. 4 is a schematic plan view of an illumination light distribution on a pupil plane.

And FIG. 14 shows a comparison result of the DOF between a non-polarized illumination light having a $\sigma$ value of 0.2, shown in FIG. 4, and an s-polarized light that is polarized parallel to the pattern's longitudinal direction, shown in FIG. 5. Thus, FIG. 14 compares the DOF for the s-polarized light with the DOF for the non-polarized light. FIGS. 4 and 5 denote an illumination light distribution on the pupil plane, and the light is uniformly incident upon a white part. The DOF of almost 0.2 μm is obtained with both the s-polarized light and the non-polarized light up to the ratio of three between the interval and the CD. As the ratio is greater than three between the interval and the CD, the DOF of only 0.1 to 0.15 μm is obtained, even with the s-polarized light. In particular, the DOF is hardly assured when the ratio becomes four between the interval and the CD.

Figure 6A:
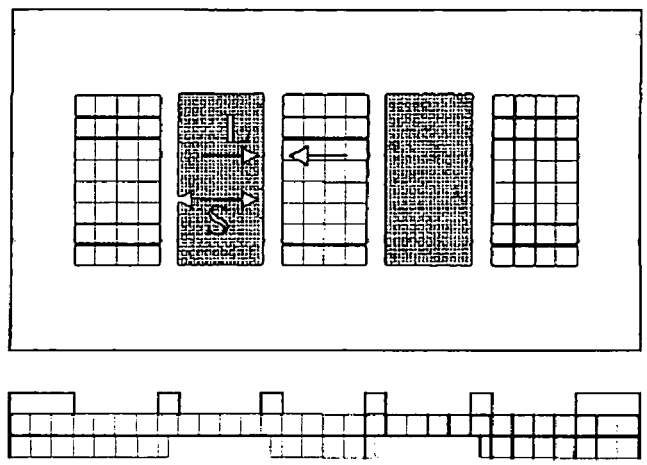
FIGS. 6A and 6B show a mask pattern and an amplitude of the diffracted light.
Figure 6B:
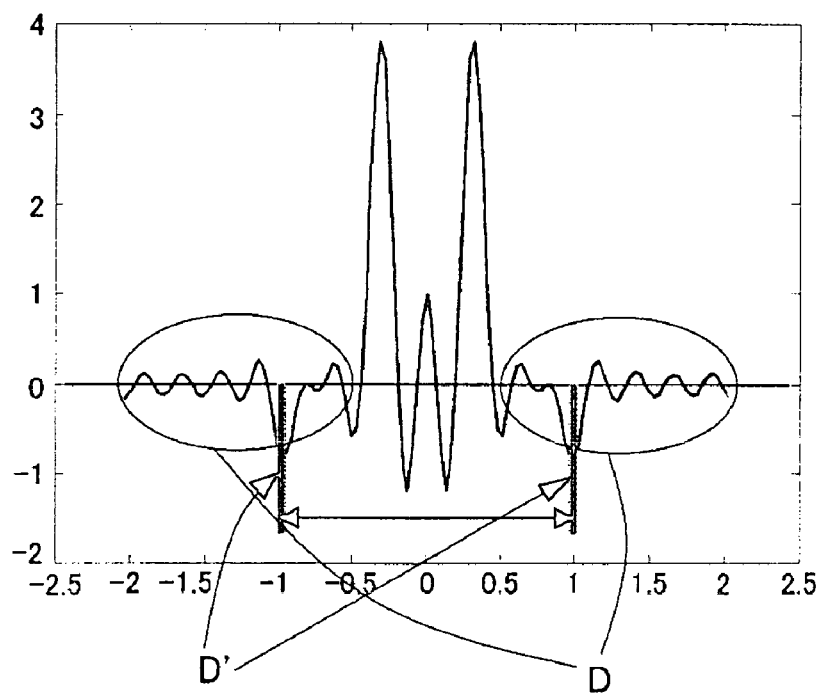

As described above, when the ratio becomes four or greater between the interval and the CD, the high order diffracted lights join the two-beam interference between the $\pm 1^{st}$ order diffracted lights. FIGS. 6A and 6B show a pattern having an S/L=4. A pattern sectional view shown in FIG. 6A has a black light shielding part, a gray shifter, and a step at the shifter on a glass plate (as shown in the view below). FIG. 6B shows the amplitude of the diffracted light, where the abscissa axis is a coordinate on the pupil plane, and a normalized pupil radius is $\pm 1$. In FIG. 6B, a diffracted light D distributes in addition to the $\pm 1^{st}$ order diffracted light.

Figure 7A:
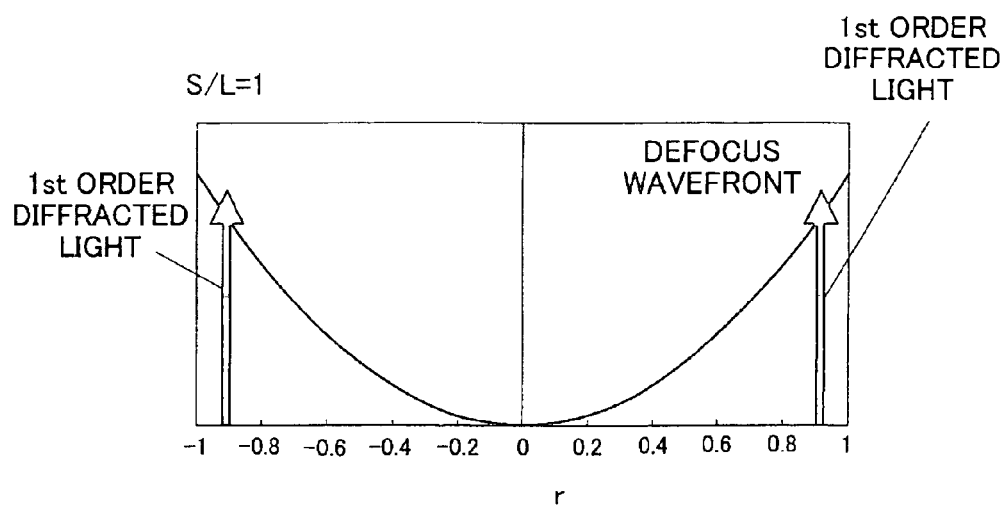
FIGS. 7A and 7B are graphs showing a relationship between the diffracted light on the pupil plane and a focus wavefront.
Figure 7B:
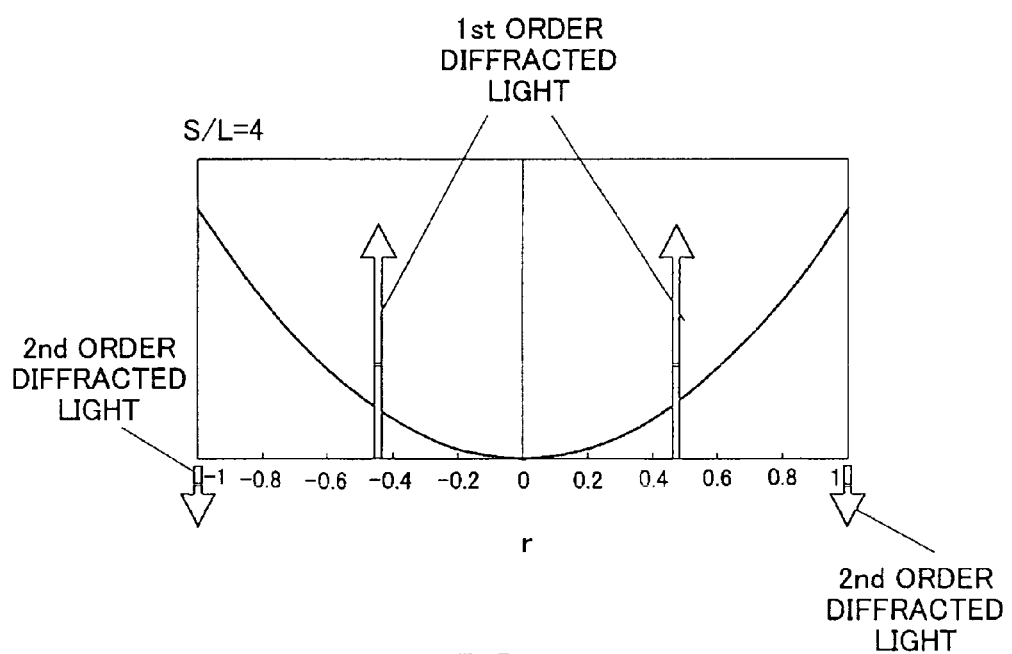

FIG. 7 diagrams the diffracted light for a better understanding. Here, FIG. 7 is a graph showing a relationship between a pupil radius and a focus wavefront. Only the $1^{st}$ order diffracted light is incident upon the pupil when the ratio is one between the interval and the CD of 45 nm. When (S/L=1), the two-beam interference between the two $1^{st}$ and $2^{nd}$ order diffracted lights for a ratio of four between the interval and the CD (S/L=4), have inverted phases, producing plus and minus amplitudes. In defocus, the focus wavefront is in proportion to almost the square of the pupil radius, and the phase-inverted diffracted lights, i.e., the $1^{st}$ and $2^{nd}$ order diffracted lights, appear on the focus wavefront and disturb imaging in defocus, narrowing the DOF.

Figure 9A:
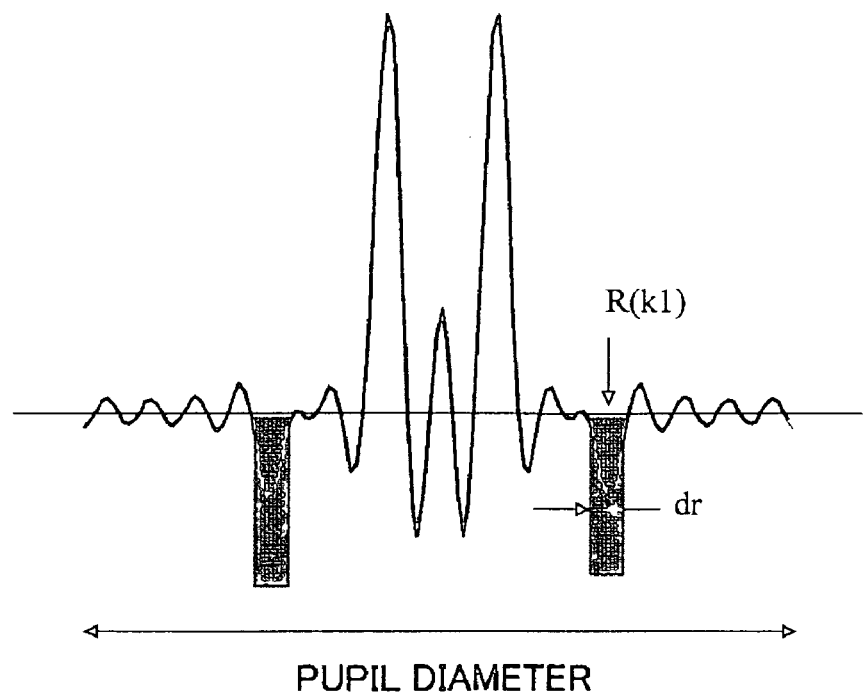
FIGS. 9A and 9B are graphs showing a relationship between the diffracted light and the phase inverted part on the pupil plane.
Figure 9B:
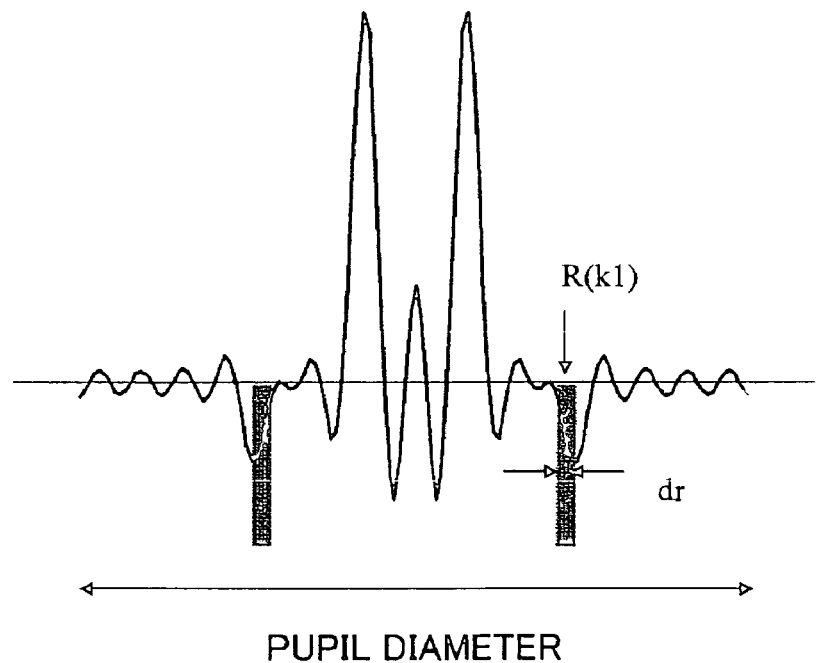

As shown in FIG. 9A, the exposure method of this embodiment inverts a phase of the pupil filter only at an illuminated part of the shaded, phase-inverted $2^{nd}$ order diffracted light, so that the phase is equal to that of the $1^{st}$ order diffracted light. In FIGS. 9A and 9B, the abscissa axis denotes a radial position of the pupil, and the pupil has a diameter such that $2^{nd}$ order or greater order diffracted lights can enter the pupil. Alternatively, as shown in FIG. 9B, this embodiment may invert half of a phase of the shaded diffracted light distribution, so that the phase inverted part cancels the phase maintained part. The alternative embodiment thus lessens imaging disturbance in defocus, extending the DOF.

Referring now to the accompanying drawings, a description will be given of an exposure apparatus 1 according to one aspect of the present invention. In each figure, like elements are designated by like reference numerals, and a duplicate description will be omitted. Here, FIG. 1 is a schematic block diagram of the exposure apparatus 1.

The exposure apparatus 1 is an immersion type projection exposure apparatus that exposes a circuit pattern of a mask 20 onto a wafer 40 via liquid LW, which is supplied in a space between the wafer 40 and the final surface of a projection optical system 30 closest to the wafer 40. The exposure apparatus 1 can use a step-and-scan manner or a step-and-repeat manner.

This exposure apparatus is suitable for a submicron or quarter-micron lithography process, and this embodiment exemplarily describes a step-and-scan exposure apparatus. The present embodiment uses the step-and-scan exposure apparatus (also referred to as a "scanner") as an example. The "step-and-scan manner," as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat manner" is another mode of exposure that moves a wafer stepwise to an exposure area for the next shot, for every shot of cell projection on the wafer.

Figure 1:
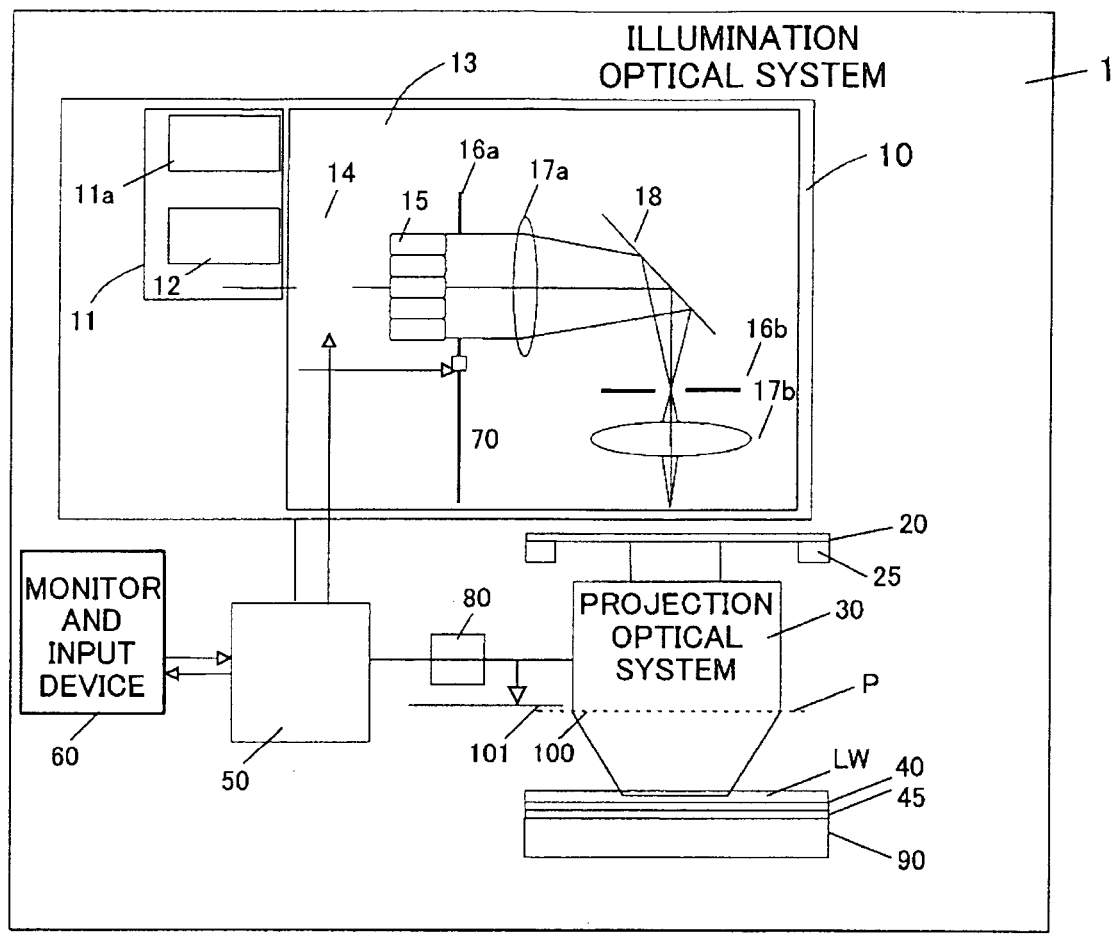
FIG. 1 is a schematic sectional view of an exposure apparatus according to one aspect of the present invention.

The exposure apparatus 1 includes, as shown in FIG. 1, an illumination optical system 13 including an illumination unit 11, a mask stage 25 that is mounted with the mask 20, a projection optical system 30, a wafer stage 45 that is mounted with the wafer 40, a controller 50, and a pupil filter 100.

The illumination apparatus 11 includes a light source section 11a and a beam shaping system 12.

The light source section 11a of this embodiment uses as a light source an ArF excimer laser with a wavelength of approximately 193 nm. However, the light source section 11a is not limited to the ArF excimer laser, and may use a KrF excimer laser with a wavelength of approximately 248 nm, and an $F_2$ laser with a wavelength of approximately 157 nm. The number of laser units is not limited. A light source applicable to the light source section 11a is not limited to a laser, and may use one or more lamps, such as a mercury lamp and a xenon lamp.

The beam shaping system 12 can use, for example, a beam expander, etc., with a plurality of cylindrical lenses. The beam shaping system 12 converts an aspect ratio of the size of the sectional shape of a parallel beam from the laser 11a into a desired value (for example, by changing the sectional shape from a rectangle to a square), thus reshaping the beam shape to a desired one. The beam shaping system 12 forms a beam that has a size and divergent angle necessary for illuminating an optical integrator 15, to be described later.

The illumination optical system 13 is an optical system that illuminates the mask 20, and includes lenses 17a and 17b, a mirror 18, an optical integrator 15, stops 16a and 16b, etc. The illumination optical system 13 may arrange, for example a condenser lens, a fly-eye lens, an aperture stop, a slit, and an imaging optical system, in this order. The optical integrator 15 may include a fly-eye lens or an integrator formed by stacking two sets of cylindrical lens array plates (or lenticular lenses), and may be replaced with an optical rod or a diffraction element. The illumination optical system 13 can use any light, whether it is on-axial or off-axial light.

The condensing optical system 14 includes necessary deflecting mirror(s) and lens(es), and efficiently introduces a beam into the optical integrator 15. For example, the condensing optical system 14 includes such a condenser lens that an exit plane of the beam shaping system 12 and an incident plane of the above optical integrator 15 is a fly-eye lens have a relationship of an object plane and a pupil plane (or a pupil plane and an image plane). This relationship may be referred to as a Fourier transformation relationship in this application. The principal ray of the light that passes the condensing optical system 14 is maintained parallel to any lens element at the center or periphery of the optical integrator 15.

The condensing optical system 14 further includes an exposure dose regulator (not shown) that can change an exposure dose of the illumination light for the mask 20 per illumination. The exposure dose regulator is controlled by the controller 50, and changes a beam sectional shape of the incident light by changing each magnification of an afocal system, or a zoom lens, etc., which moves in the optical-axis direction and changes an angular magnification.

The shaped beam from the laser passes the condensing optical system 14 that has a polarization element, and is directed to the incident plane of the optical integrator 15. The beam from the laser is a linearly polarized light, and the polarization element, such as a wave plane, controls a polarization direction in the condensing optical system 14.

The optical integrator 15 makes uniform illumination light that illuminates the mask 20, and forms a plurality of secondary light sources near the exit plane. When the optical integrator 15 is a fly-eye lens, it includes a multiplicity of rod lenses (or fine lens elements). However, as discussed above, the optical integrator 15 usable for the present invention is not limited to the fly-eye lens, and can include an optical rod, a diffraction grating, plural pairs of cylindrical lens array plates that are arranged so that these pairs are orthogonal to each other, etc.

Provided right after the exit plane of the optical integrator 15 is the aperture stop 16a that has a fixed shape and diameter. The aperture stop 16a is arranged at a position approximately conjugate to the effective light source on the pupil 31 of the projection optical system 30, as discussed later, and the aperture shape of the aperture stop 16a corresponds to the effective light source shape on the pupil 31 plane in the projection optical system 30. The aperture stop 16a controls a shape of the effective light source, as described later.

Various aperture stops 16a can be switched in accordance with the illumination condition, so that a stop is located on the optical path by a stop exchange mechanism (or actuator) 70. The aperture stop 16a may be integrated with polarization control means.

The condenser lens 17a collects all the beams that have exited from a secondary light source near the exit plane of the optical integrator 15 and passed through the aperture stop 16a. The beams are reflected by the mirror 18, and uniformly illuminate or Koehler-illuminate the masking blade 16b plane.

The masking blade 16b includes plural movable light shielding plates, and has an approximately rectangular opening shape when the projection optical system 30 is dioptric. The light that has passed through the opening of the masking blade 16b is used as illumination light for the mask 20. The masking blade 16b is a stop having an automatically variable opening width, thus longitudinally changing a transfer area on the wafer 40 corresponding to an aperture slit. The exposure apparatus 1 may further include a scan blade, with a structure similar to the above masking blade 16b, which laterally varies the transfer area as a one-shot scan exposure area. The scan blade is also a stop having an automatically variable opening width, and is placed at an optically approximately conjugate position to the plane of the mask 20. The exposure apparatus 1 uses these two variable blades to set the dimensions of the transfer area in accordance with the dimensions of an exposure shot.

The imaging lens 17b transfers an aperture shape of the masking blade 16b onto the mask 20 plane to be illuminated, and projects a reduced image of the mask 20 onto the wafer 40 plane installed on a wafer chuck (not shown).

The mask 20 has a circuit pattern or a pattern to be transferred, and is supported and driven by a mask stage 25. Diffracted light emitted from the mask 20 passes the projection optical system 30, and then, is projected onto the wafer 40. The mask 20 and the wafer 40 are arranged in an optically conjugate relationship. The exposure apparatus in this embodiment is a scanner and, therefore, synchronously scans the mask 20 and the wafer 40 at a speed ratio of a reduction ratio to transfer a pattern on the mask 20 onto the wafer 40. If it is a step-and-repeat exposure apparatus (referred to as a "stepper"), the mask 20 and the wafer 40 remain stationary during exposure.

The mask stage 25 is installed on a stage stool. The mask stage 25 supports the mask 20 via a reticle chuck, and is moved by a transport mechanism (not shown) and the controller 50. The transport mechanism (not shown) is made of a linear motor, and the like, and drives the mask stage 25 in an X direction, thus moving the mask 20.

The projection optical system 30 serves to image the diffracted light that has been generated by the patterns of the mask 20 onto the wafer 40. The projection optical system 30 may use a dioptric optical system solely composed of a plurality of lens elements, a catadioptric optical system comprised of a plurality of lens elements and at least one concave mirror, etc. Any necessary correction of the chromatic aberration may use a plurality of lens units made from glass materials having different dispersion values (Abbe values), or arrange a diffractive optical element such that is disperses in a direction opposite to that of the lens unit.

The wafer 40 is fed from the outside of the exposure apparatus 1 by a wafer feeding system (not shown), and is supported and driven by the wafer stage 45. The wafer 40 is replaced with a liquid crystal plate and another plate to be exposed in another embodiment. A photoresist is coated on the wafer 40.

The wafer 40 is supported by the wafer stage 45 by a wafer chuck. The wafer stage 45 serves to adjust a longitudinal or vertical position of the wafer 40 and its inclination in the rotating direction, and is controlled by a stage controller 90. During exposure, the stage controller 90 controls the wafer stage 45 so that the focal plane of the projection optical system 30 always accords with the wafer 40 surface.

The controller 50 controls and communicates with an input/output ("I/O") device 60, an actuator 70, a pupil filter driver 80, and a stage controller 90, so as to control the aperture stop 16a, the wafer stage 45, and the pupil filter 100, which will be described later.

The I/O device 60 inputs and outputs data. The data contains information obtained from the controller 50.

The actuator 70 switches the aperture 16a so that it is aligned with the optical path. The controller 50 controls driving of the actuator 70.

The pupil filter driver 80 exchanges and holds the pupil filter 100, which will be described later. While this embodiment holds two pupil filters 100 and 101, the present invention does not limit the number of pupil filters.

The stage controller 90 controls driving of the mask stage 25 and the wafer stage 45.

The liquid supply part (not shown) serves to supply the liquid LW between the projection optical system 30 and the wafer 40.

The liquid LW serves to shorten the equivalent wavelength of the exposure light from the light source section 11a, and improves the exposure resolution. This embodiment uses, but is not limited to, pure water for the liquid LW. The liquid LW should have a high transmittance and a high refractive index to the exposure light, and be chemically stable to the projection optical system 30 and the resist on the wafer 40. For example, the liquid LW may be an organic fluid or water with a minute amount of additive.

A liquid recovery part (not shown) recovers, via a recovery pipe, the liquid LW supplied to a space between the final surface of the projection optical system 30 and the wafer 40. The liquid recovery part includes, for example, a tank that temporarily stores the recovered liquid LW, a suction part that sucks the liquid LW, etc.

The pupil filter 100 is located near the pupil plane P in the projection optical system 30, and changes a phase distribution. The pupil filter 100 is exchangeable with the other pupil filter 101 or is deformable. The controller 50 controls exchange and deformation of the pupil filter 100.

Figure 2:
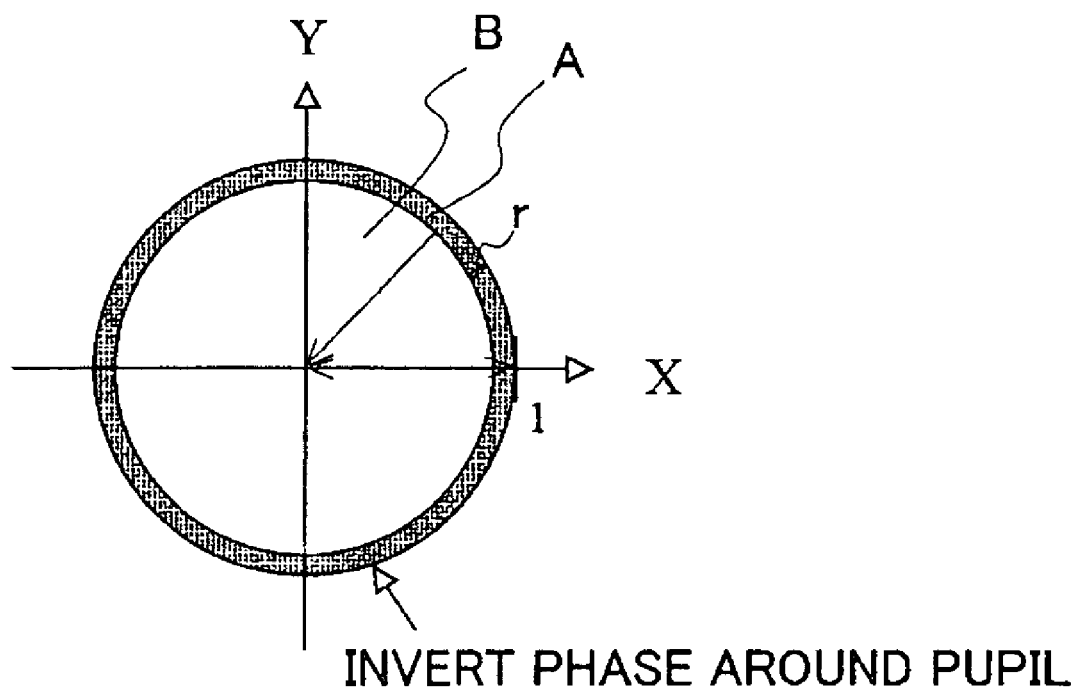
FIG. 2 is a schematic plan view of a pupil filter in the exposure apparatus shown in FIG. 1.
Figure 3:
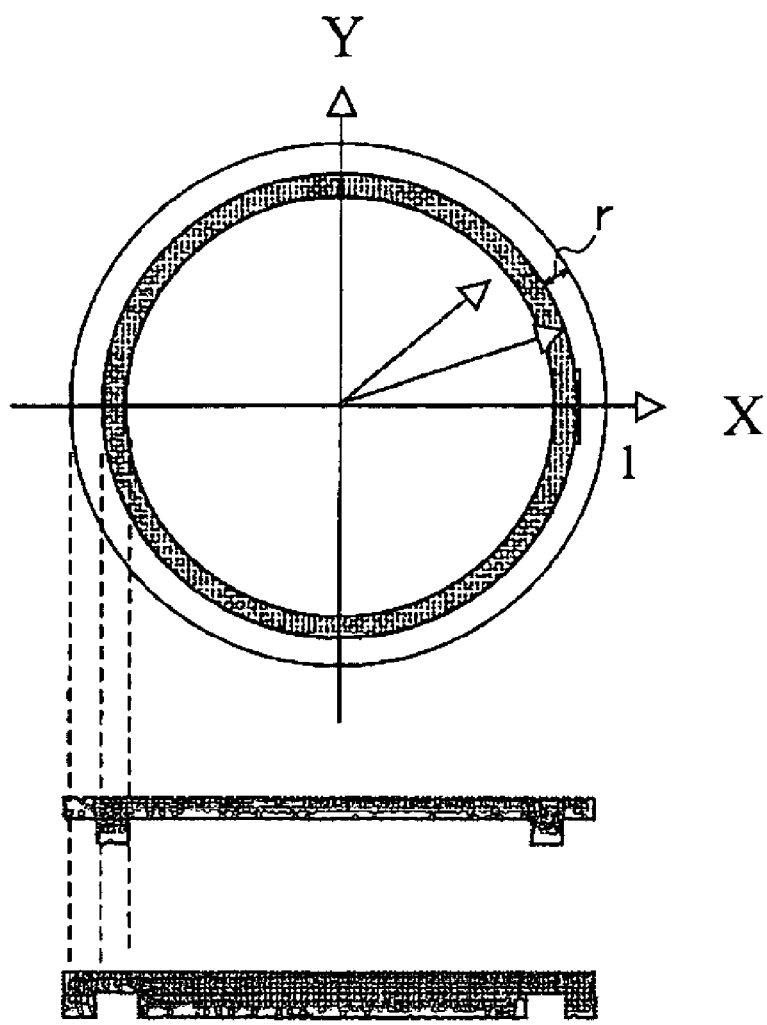
FIG. 3 is a schematic plan view showing another embodiment of the pupil filter shown in FIG. 2.

The pupil filter 100 has, as shown in FIG. 2, a first area B and a second area A, and generates a phase difference to the incident light. A phase-difference generating method includes a method of cutting a plane-parallel plate, such as glass, to generate a phase difference, a method of attaching a phase film to an optical element, such as a lens and a mirror, a method of deforming a mirror to generate a partial phase difference, etc. The first method cuts the plane-parallel plate, such as glass, and forms an undulation on the mirror surface, as shown in FIG. 3. While the mirror in FIG. 3 does not have a curvature, it may have a curvature. Here, FIGS. 2 and 3 are front views of the pupil filter 100.

A smaller σ illumination condition with good coherency is effective. A σ value of 0.2 or smaller is suitable for the alternating or chromeless PSM. The smaller σ illumination condition that contains a perpendicular incident component and does not contain an extremely obliquely incident component is also suitable for a binary mask and an attenuated PSM, as well as the chromeless PSM.

As shown in FIGS. 2 and 3, in the pupil filter 100, a radius from the center of the first area B to an outer end of the second area A is normalized to one, and r denotes a radial position of the second area A on the pupil.

A first method uses a pupil filter that inverts a phase of half of the high order diffracted light (at one side from a peak position) relative to the other half side, as shown in FIG. 9B, and cancels the high order diffracted light by the following equation:

$$R(k1)-dr \leq r \leq R(k1) \qquad \text{[EQUATION 1]}$$

or $$R(k1) \leq r \leq R(k1)+dr. \qquad \text{[EQUATION 2]}$$

R(k1) is a center position of the high order diffracted light in the radial direction. It depends on the half pitch L of a pattern that is converted by k1=L/λ×NA. The high order diffracted light does not contain the 1st order diffracted light of the object spectrum. The term "dr" is a width between the peak position of an amplitude and the position where the amplitude appears.

The first method intends to cancel the high order diffracted light from a pattern near a specific pitch, extending the DOF.

Figure 8A:
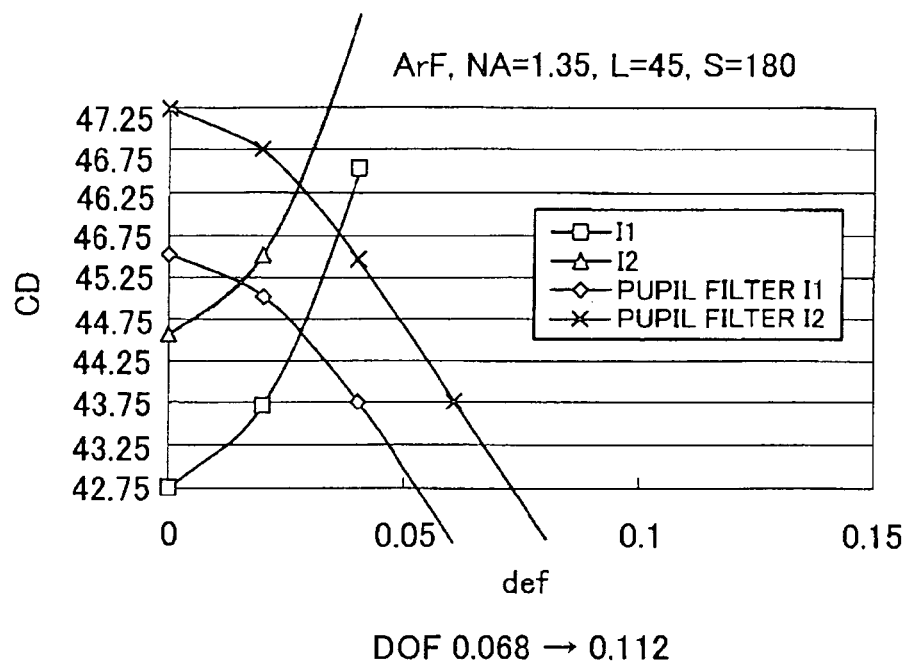
FIGS. 8A and 8B are graphs showing a relationship between a critical dimension ("CD") and a defocus.
Figure 8B:
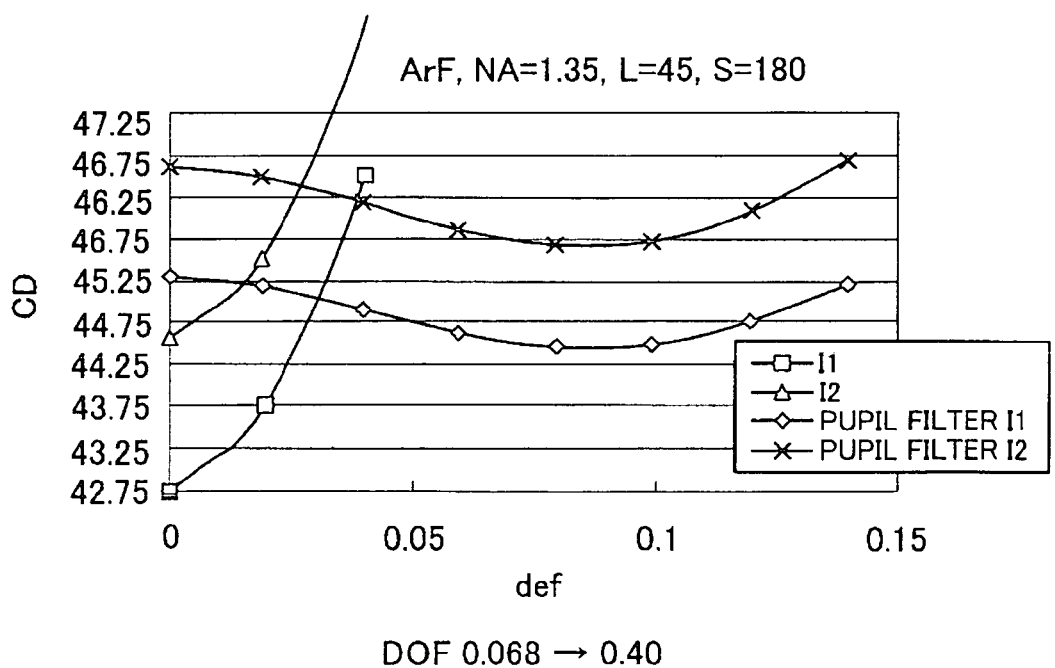

For example, assume that a sparse pattern having a CD of 45 nm and an interval of 45 nm×4=180 nm is exposed with exposure light as an ArF excimer laser, a projection optical system that has an NA of 1.35 and a pupil filter in accordance with Equation 1 or Equation 2, and an illumination condition having a σ value of 0.2. Under the first method, a relationship between the CD and the defocus is as shown in FIG. 8B. FIGS. 8A and 8B are graphs showing a relationship between the CD and the defocus between the exposure dose upper and lower limits I1 and I2.

As shown in FIG. 8B, the DOF is significantly extended from 0.07 μm to 0.40 μm for a ratio of four between the interval and the CD with a non-polarized light having a σ value of 0.2.

A second method uses a pupil filter that inverts a phase of the high order diffracted light equal to that of the low order diffracted light. The pupil filter inverts a phase at a part where the phase-inverted $2^{nd}$ order diffracted light transmits (or reflects in the case of a mirror) part, thereby making the phase of the $2^{nd}$ order diffracted light equal to that of the $1^{st}$ order diffracted light.

Thereby, even when a pattern interval is large, the high order diffracted light that occurs in addition to the ±$1^{st}$ order diffracted lights, and is equiphase to the ±$1^{st}$ order diffracted light does not disturb imaging in defocus, extending the DOF.

This is because the antiphase high order diffracted light interferes with the $1^{st}$ order diffracted light.

More specifically, as shown in FIG. 9A, the second area A satisfies Equation 3 below, where R(k1) is an irradiation peak position of the high order diffracted light that has an antiphase to the low diffracted light, and "dr" is a width between the position of a peak and the position where the amplitude disappears:

$$R(k1)-dr \leq r \leq R(k1)+dr. \qquad \text{[EQUATION 3]}$$

When the second area satisfies Equation 3 and a phase is inverted at an annular part with a position r, the DOF is extended for a pattern near a specific pitch.

As in the first method, a sparse pattern having a CD of 45 nm and an interval of 45 nm×4=180 nm is exposed with exposure light as an ArF excimer laser, a projection optical system that has an NA of 1.35 and a pupil filter having a phase distribution in accordance with Equation 3, and an illumination condition having a σ value of 0.2. Then, a relationship between the CD and defocus is as shown in FIG. 8A.

As shown in FIG. 8A, the DOF is extended from 0.07 μm to 0.11 μm for a ratio of four between the interval and the CD with a non-polarized light. The DOF is extended from 0.09 μnm to 0.13 μm with an s-polarized light.

An exposure method will now be described below:

First Embodiment

The light that has passed the mask 20 and reflected by the mask pattern is imaged on the wafer 40 via the projection optical system 30 and the liquid LW. Assume that a sparse pattern having a CD of 45 nm is exposed with exposure light as an ArF excimer laser, and a projection optical system that has an NA of 1.35. A position r of the pupil filter shown in FIG. 2 satisfies the following condition:

$$0.9 \leq r \leq 1.0. \qquad \text{[EQUATION 4]}$$

Figure 15A:
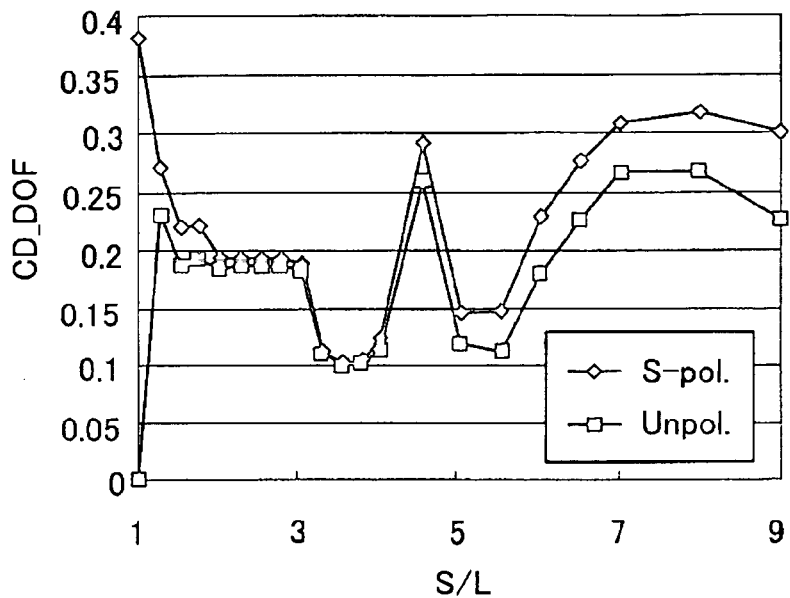
FIGS. 15A and 15B are graphs showing a relationship between a depth of focus ("DOF") and a ratio (S/L). S is the interval of a line pattern. L is a line width of the line pattern.

FIG. 15A is a graph of the DOF by changing a ratio between the interval and the CD of the pattern while fixing the CD to 45 nm. The polarization state is compared between an s-polarized light and a non-polarized light. In comparison with FIG. 14, which uses no pupil filter, use of a pupil filter would extend the DOF, as shown in FIG. 15A, with respect to any ratio between the interval and the CD. The s-polarized light significantly enhances an effect. Despite a problem in that the exposure dose tolerance lowers with the non-polarized light at a dense part that equalizes the interval with the CD, the pupil filter is effective to the sparse pattern even with the non-polarized light.

Second Embodiment

As in the first embodiment, the light that has passed the mask 20 and is reflected by the mask pattern is imaged on the wafer 40 via the projection optical system 30 and the liquid LW. Assume that a sparse pattern having a CD of 45 nm is exposed with exposure light as an ArF excimer laser, and a projection optical system that has an NA of 1.35. A position R of the pupil filter 100, shown in FIG. 2, satisfies the following condition:

[Equation 5]

$$0.90 \leq r \leq 1.0 \qquad \text{Equation 5-1}$$

$$0.925 \leq r \leq 1.0 \qquad \text{Equation 5-2}$$

$$0.95 \leq r \leq 1.0 \qquad \text{Equation 5-3.}$$

Figure 15B:
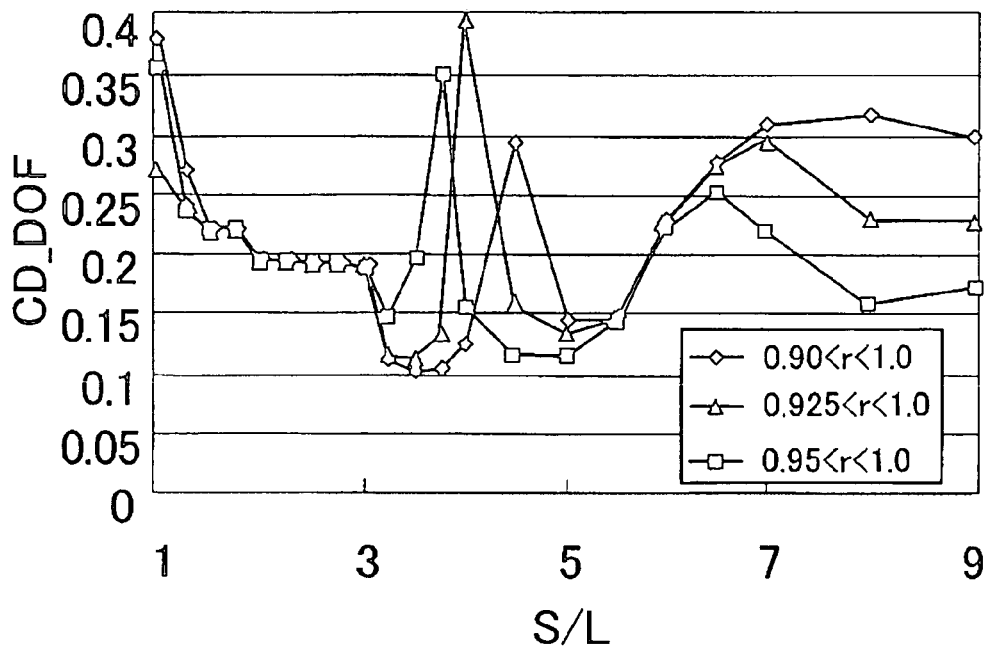

FIG. 15B is a graph of the DOF that uses a range of a position r on the pupil plane as a parameter by changing the ratio between the interval and the CD of the pattern, while fixing the CD to 45 nm. The diamond-shape shows the characteristic of the filter which fills Equation 5-1, the triangle shows the characteristic of the filter which fills Equation 5-2, and the square shows the characteristic of the filter which fills Equation 5-3. One mask pattern usually defines a pattern's pitch. When the r range is changed in accordance with the pattern's specific pitch or near the pitch that satisfies one of Equations 5-1 to 5-3, the DOF of the specific pitch is significantly extended.

Third Embodiment

The pupil filter 100 is effective to a contact hole pattern also, although the above embodiments relate to the line pattern.

Figure 16:
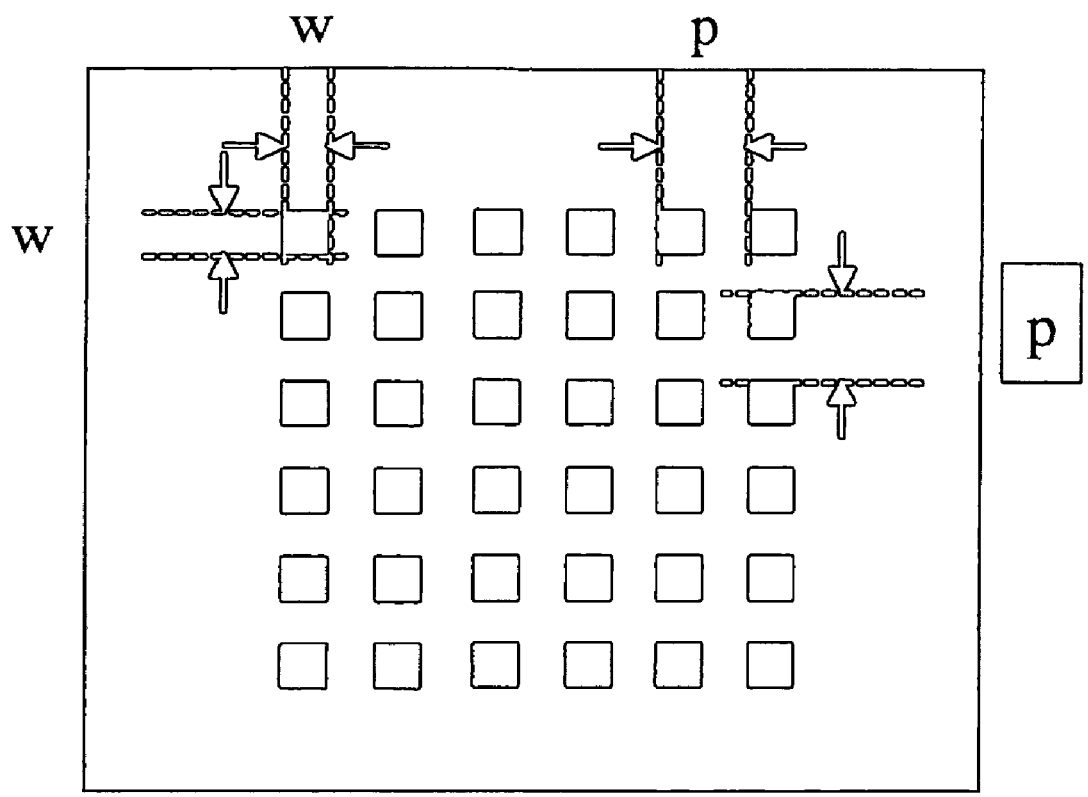
FIG. 16 is a schematic plan view of a contact hole pattern.

Assume that exposure light is an ArF excimer laser, a projection optical system has an NA of 1.35, and an illumination condition has a σ value of 0.2, and uses a non-polarized light. A binary mask has a pattern shown in FIG. 16, and has fine contact holes with a width w of 55 nm and a pitch p of 110 nm when converted into a size of the wafer plane. Here, FIG. 16 is a plan view of contact holes, where a white part is a light transmitting part, and black is a light shielding part made of a chrome applied glass plate. The transmitting light forms the contact holes.

Figure 17:
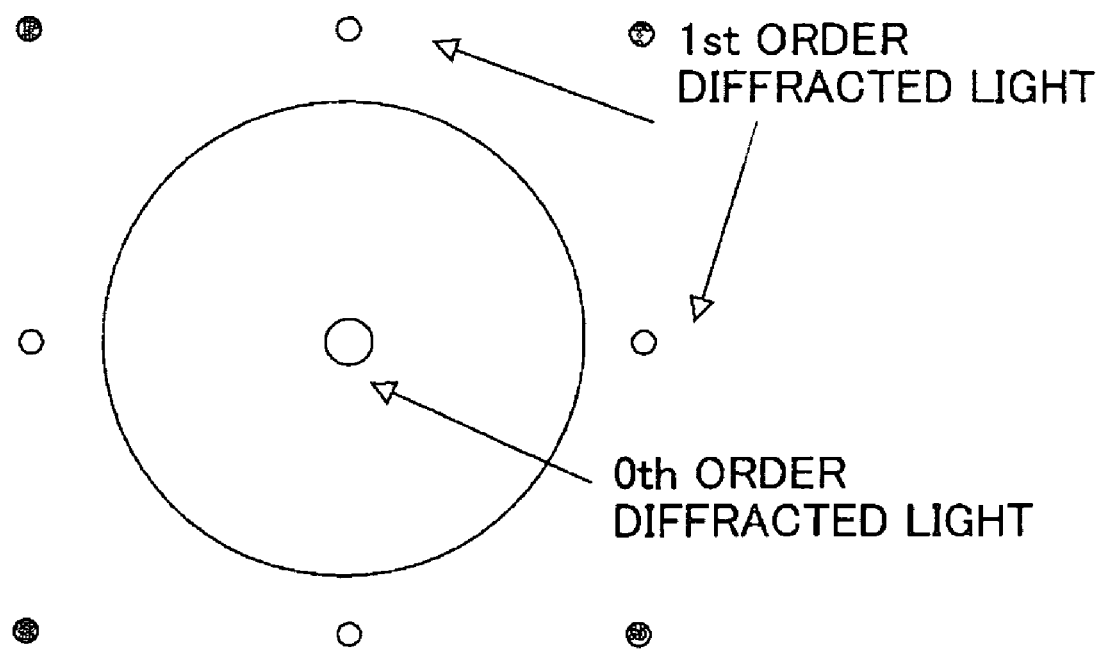
FIG. 17 is a schematic plan view showing a diffracted light distribution from the contact hole pattern.

FIG. 17 is a plan view of a diffracted light pattern on the pupil plane. A circle in FIG. 17 indicates a size of the pupil. Only the $0^{th}$ order light transmits the pupil in the perpendicularly incident light, and the $1^{st}$ order diffracted light does not transmit the pupil. Therefore, the contact holes having a pitch of 110 nm are not resolved.

An alternating PSM inverts phases of adjacent light transmitting parts, as shown in FIG. 19. FIG. 19 is a plan view of the alternating PSM, in which a gray part is a phase shifter that is a light transmitting part whose phase is inverted from the white part by 180°.

Figure 20:
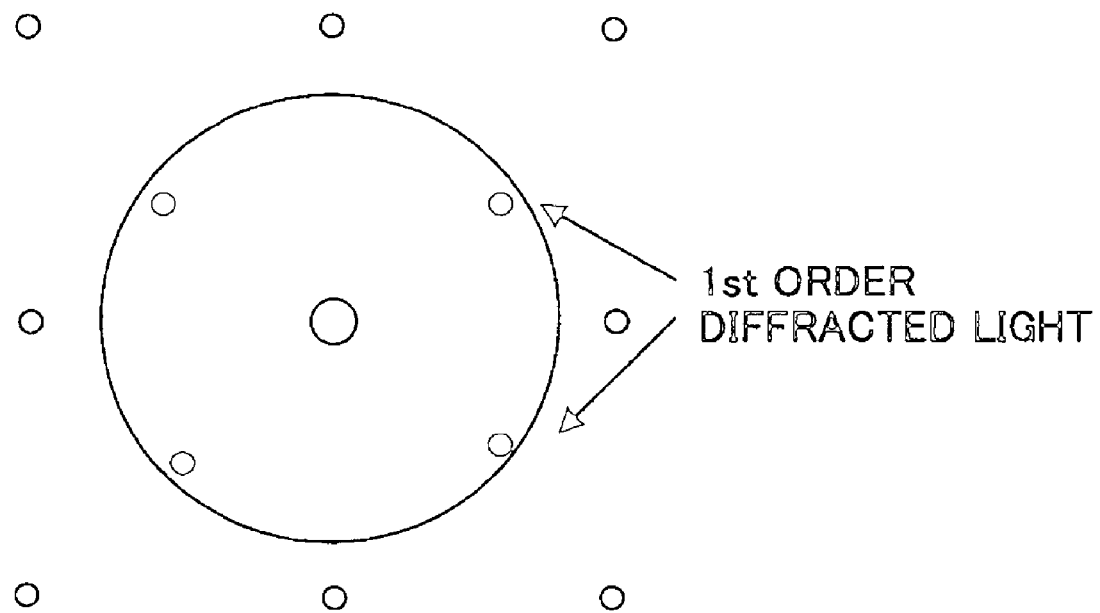
FIG. 20 is a schematic plan view of a diffracted light distribution of an Alt-PSM.

A chromeless type PSM that has no chrome is as shown in FIG. 18. FIG. 18 is a plan view of a chromeless PSM. As shown in FIG. 20, the light that transmits the PSM halves, on the pupil plane, a pitch of the $1^{st}$ order diffracted light for the binary mask. In FIG. 20, the black-dot $1^{st}$ order diffracted light transmits through the pupil, and the contact holes having a pitch of 110 nm can be resolved. Although the $0^{th}$ order light and the $1^{st}$ order diffracted lights for the binary mask are extinguished, they are shown as white dots for comparison purposes. Here, FIG. 20 is a plan view of the diffracted light pattern from the alternating PSM.

Figure 23:
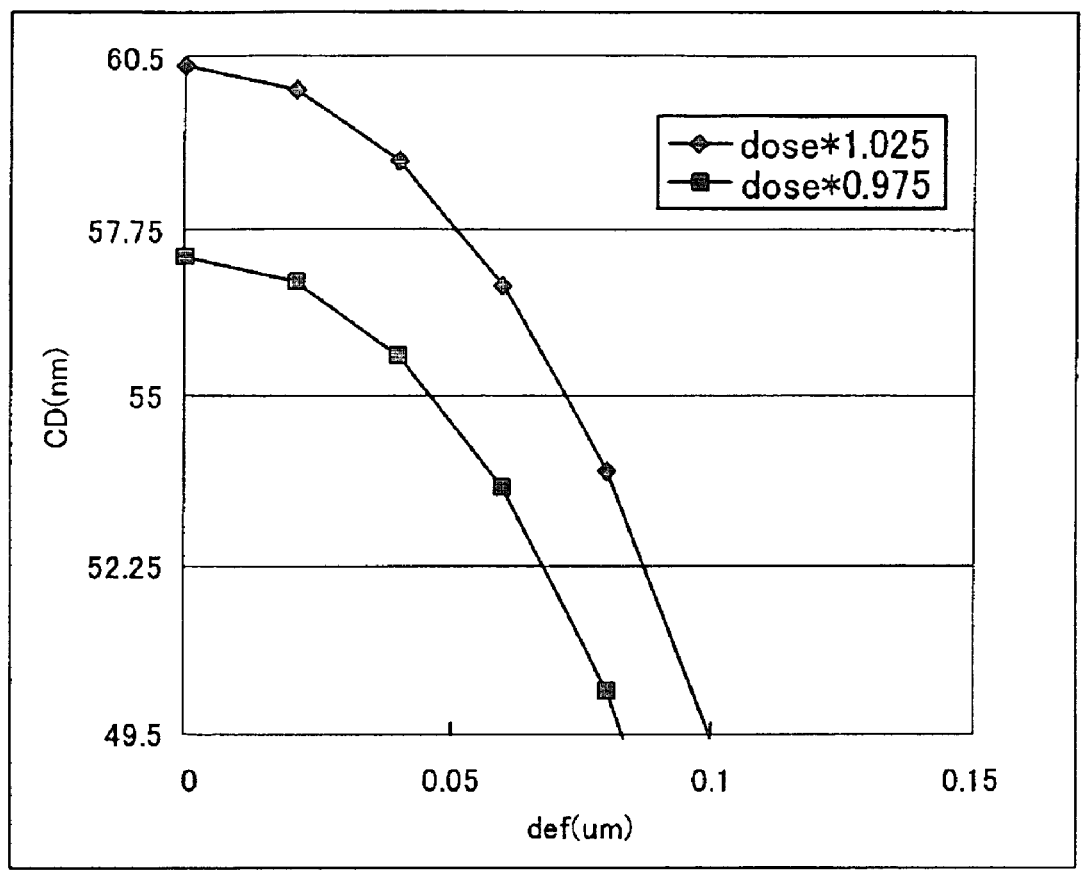
FIG. 23 is a graph showing a relationship between the CD and defocus for the contact hole pattern. The hole width is 55 nm and the interval of a hole is 55 nm.

Such a dense contact hole pattern exhibits good resolution performance and assures a sufficient DOF. FIG. 23 shows a CD change in defocus when the contact hole width on the defocus image plane is calculated by simulation. FIG. 23 shows a CD change relative to defocus in a range of ±2.5% of the exposure dose that provides the maximum DOF, and an error of the hole width of 55 nm is shown in a range of 10%. When ±2.5% of the exposure does varies for the hole width of 55 nm, the DOF that provides a width error of ±10% is 0.08×2=0.16 μm. Here, FIG. 23 is a graph showing a relationship between the CD and the defocus.

Figure 21:
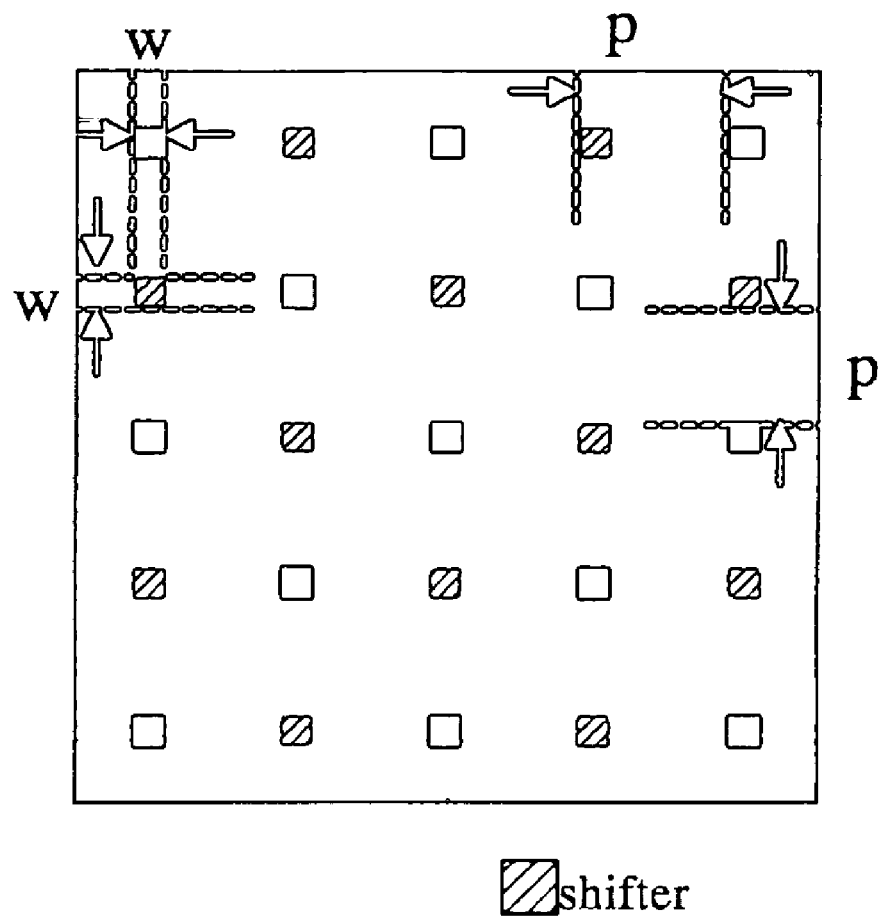
FIG. 21 is a schematic plan view of an Alt-PSM.
Figure 22:
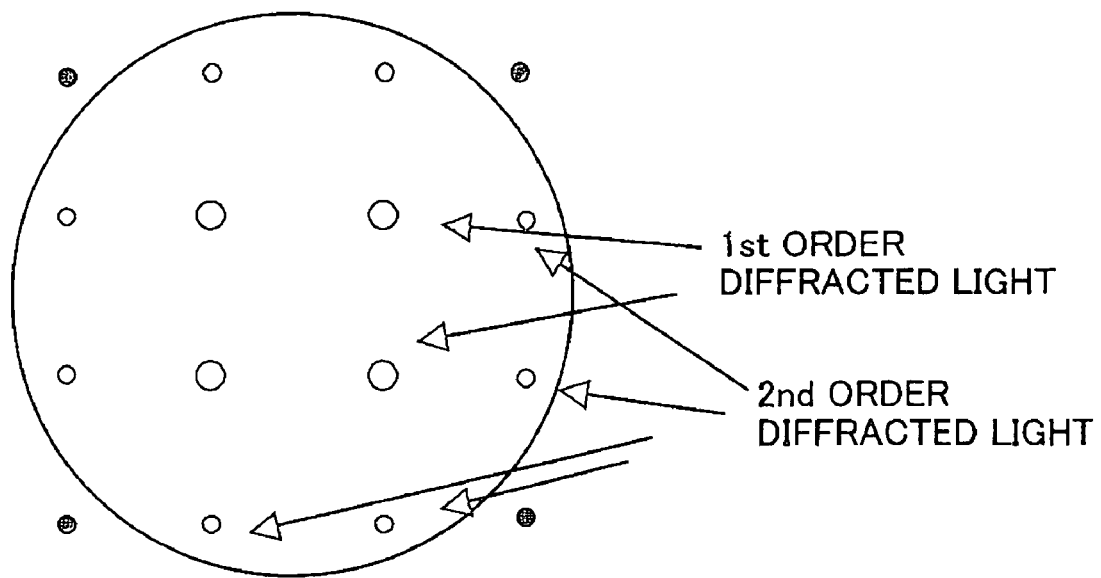
FIG. 22 is a schematic plan view of a diffracted light distribution of an Alt-PSM.

When an interval of the 55 nm contact hole is made 220 nm as four times as broad as 55 nm, its pitch is 275 nm and the alternating PSM is as shown in FIG. 21. As shown in the diffracted light pattern in FIG. 22, the $1^{st}$ and $2^{nd}$ diffracted lights transmit the pupil plane. Here, FIG. 21 is a plan view of the alternating PSM, and FIG. 22 is a plan view showing the diffracted light on the alternating PSM.

While a chromeless PSM can be used for a sparse pattern when the light shielding pattern forms a pattern, such as a line pattern, the chromeless PSM cannot be used for a sparse contact hole pattern.

Figure 24:
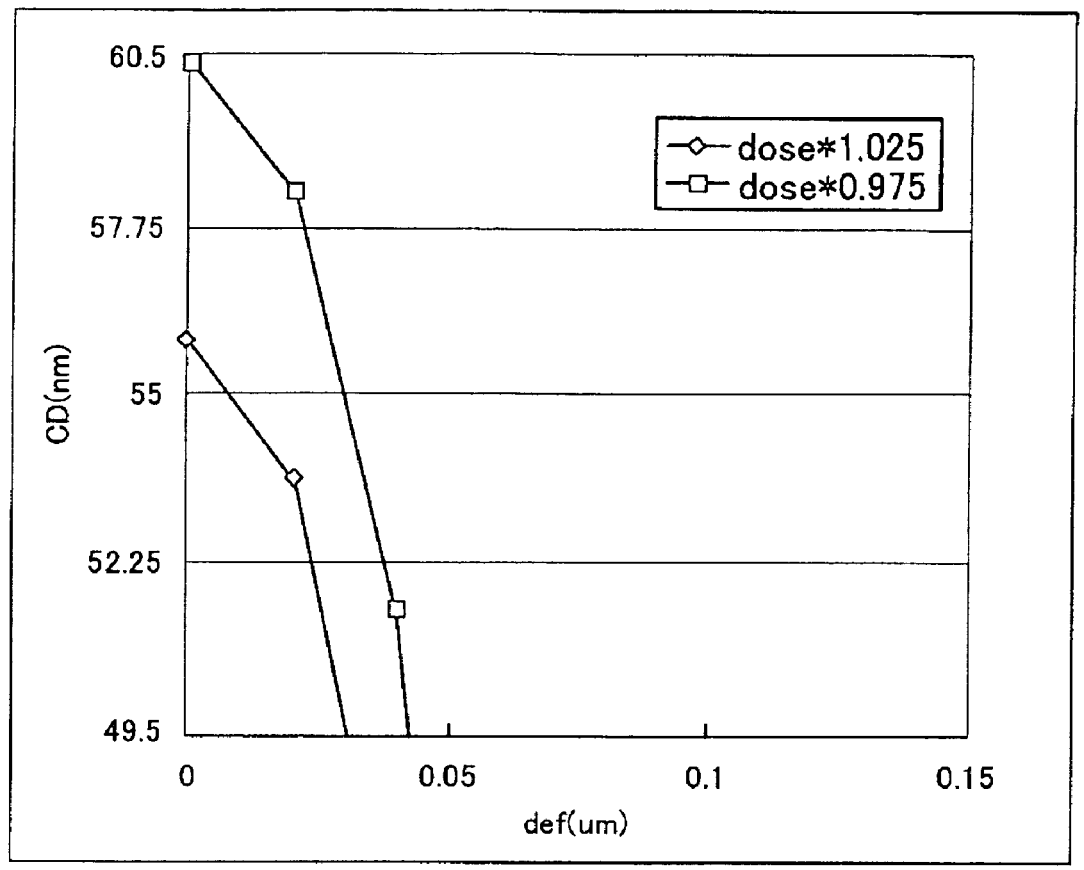
FIG. 24 is a graph showing a relationship between the CD and defocus for the contact hole pattern. The hole width is 55 nm and the interval of a hole is 220 nm.

Similar to the line pattern, for a sparse pattern as in FIG. 21, the obtained DOF is insufficient. The CD abruptly changes due to defocus, as shown in FIG. 24, and the DOF is at most 0.06 μm. Here, FIG. 24 is a graph showing a relationship between the CD and defocus.

Figure 25:
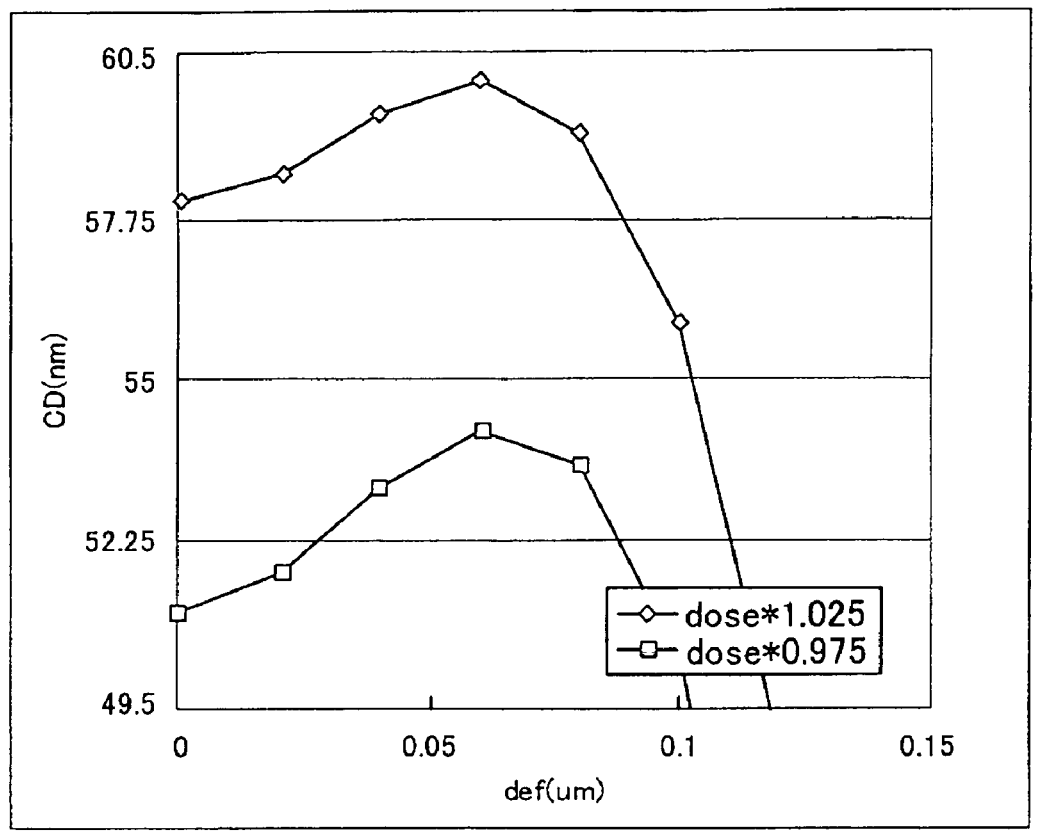
FIG. 25 is a graph showing a relationship between the CD and defocus for the contact hole pattern using the pupil filter. The hole width is 55 nm and the interval of a hole is 220 nm.

Use of the pupil filter 100 of this embodiment having a pupil radius r (r≦1) and a phase inversion between 0.9≦r≦1.0 would provide a DOF of 0.2 μm or greater, as shown in FIG. 25. Here, FIG. 25 is a graph showing a relationship between the CD and defocus.

While this embodiment is directed to the alternating PSM, this binary mask and the attenuated PSM can also provide the increased DOF effect when the illumination light contains the perpendicularly incident light and is not so extremely obliquely incident.

Use of the exposure method and apparatus would provide the DOF of 0.15 μm or greater, except for a limited pitch. The DOF of 0.15 μm or greater can be obtained for a 45 nm sparse pattern by using an optimal phase distribution of the filter in accordance with the principal pitch in the mask pattern.

Figure 26:
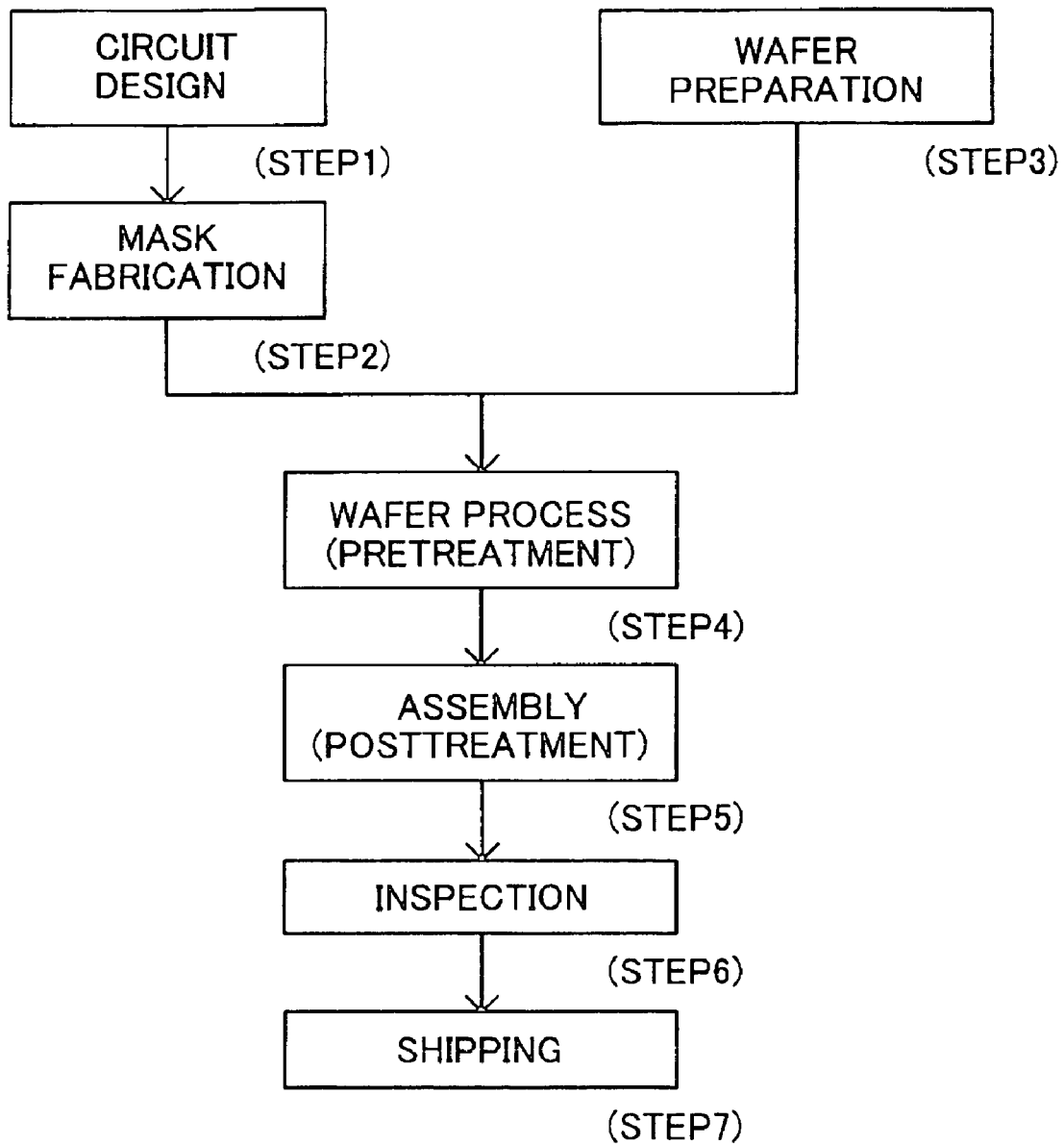
FIG. 26 is a flowchart for explaining the manufacture of devices (such as semiconductor chips, such as ICs and LCDs, CCDs, and the like).
Figure 27:
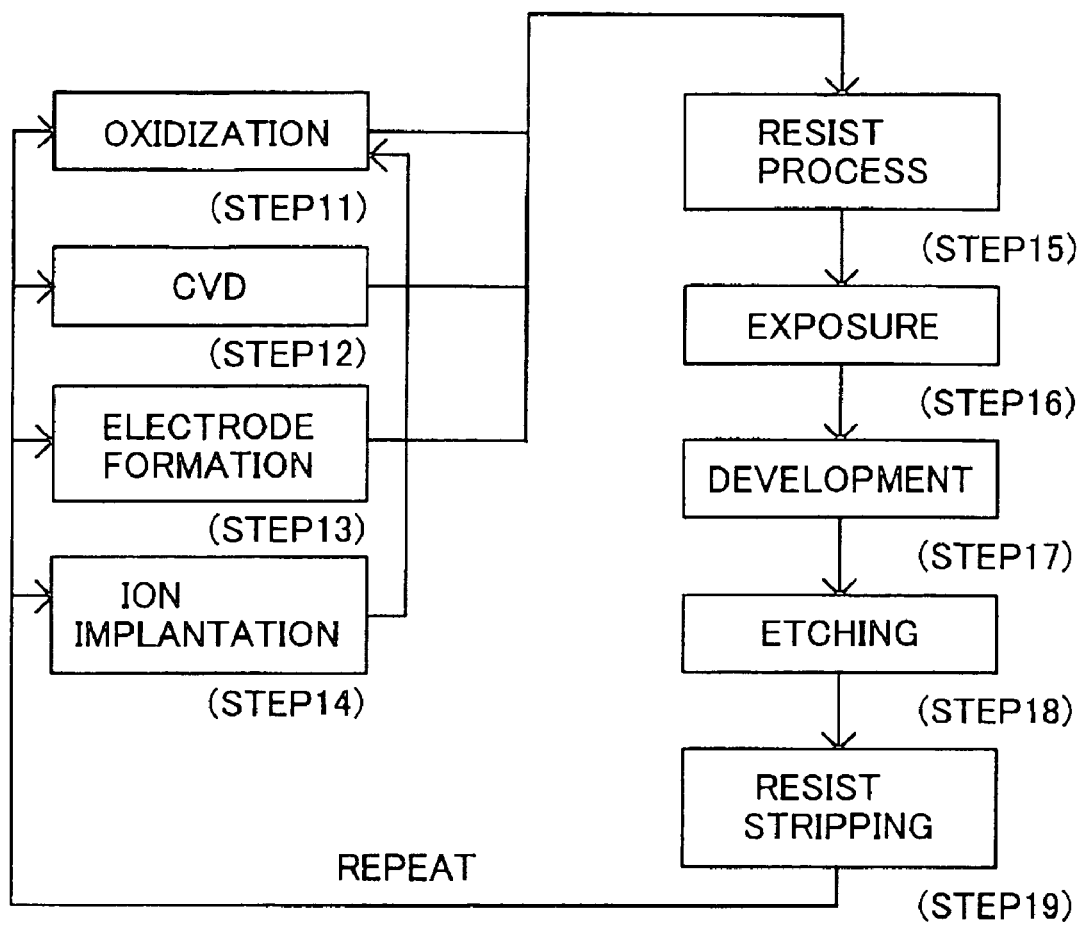
FIG. 27 is a detailed flowchart of a wafer process of Step 4 shown in FIG. 26.

Referring to FIGS. 26 and 27, a description will now be given of an embodiment of a device manufacturing method using the above exposure apparatus 1. FIG. 26 is a flowchart for explaining a fabrication of devices (i.e., semiconductor chips, such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having the designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 27 is a detailed flowchart of the wafer process shown in Step 4. Step 11 (oxidation) oxidizes the surface of the wafer. Step 12 (CVD) forms an insulating film on the surface of the wafer. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 1 to expose a circuit pattern of the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The device manufacturing method of the present invention may manufacture higher quality devices than does the conventional method. Thus, a device manufacturing method using the exposure apparatus 1, and a resultant device, also constitute aspects of the present invention.

Further, the present invention is not limited to these preferred embodiments, and various modifications and changes may be made in the present invention without departing from the spirit and scope thereof.

What is claimed is:

1. An exposure apparatus comprising a projection optical system for projecting a pattern of a mask onto a plate to be exposed, said projection optical system comprising:
   a pupil filter that includes a first area arranged on a light axis of the projection optical system and a second area formed outside of the first area,
   wherein the mask is one of an alternating phase shift mask and a chromeless phase shift mask, and the pattern of the mask satisfies:

$(p/\lambda) \cdot NA \leq 0.65$, where p is a half pitch of the pattern, $\lambda$ is a wavelength of light illuminating the mask, and NA is an image-side numerical aperture of the projection optical system,
   wherein, at most, $1^{st}$ order light of diffracted light, which is diffracted by the pattern satisfying $(p/\lambda) \cdot NA \geq 0.65$, passes the first area and a part of the diffracted light having one order of at least $2^{nd}$ order light passes the second area, and
   with respect to the light having one order among the at least $2^{nd}$ order light of the diffracted light, a phase of the light that has passed the second area and a phase of the light that has passed an area other than the second area of the pupil filter are inverted with each other, and
   wherein the second area in the pupil filter exists only in a part where a distance from a center of the first area is at least 0.9 when a radius of a pupil of the projection optical system is 1.

2. An exposure apparatus according to claim 1, wherein half of the light having one order of the at least $2^{nd}$ order light passes the second area.

3. An exposure apparatus according to claim 1, wherein an illumination condition of said exposure apparatus has a perpendicularly incident component with a σ of, at most, 0.2, where σ is a ratio between a numerical aperture of a mask-side illumination optical system for illuminating the mask and an object-side numerical aperture of the projection optical system.

4. An exposure apparatus according to claim 1, wherein the second area has an annular shape, and the second area satisfies:

$R(k1) - dr \leq r \leq R(k1)$ or $R(k1) \leq r \leq R(k1) + dr$, where r is a radius of the second area, R(k1) is an irradiation peak position of the light having one order of the at least $2^{nd}$ order light, and dr is a width between the position of a peak and the position where amplitude disappears.

5. An exposure apparatus according to claim 1, wherein one of the alternating phase shift mask and the chromeless phase shift mask further includes a pattern that satisfies $(p/\lambda) \cdot NA < 0.5$.

6. A device manufacturing method comprising the steps of:
   exposing a plate using the exposure apparatus according to claim 1; and
   developing the plate that has been exposed.

* * * * *